US008624688B2

(12) United States Patent
Essenwanger

(10) Patent No.: US 8,624,688 B2
(45) Date of Patent: Jan. 7, 2014

(54) WIDEBAND, DIFFERENTIAL SIGNAL BALUN FOR REJECTING COMMON MODE ELECTROMAGNETIC FIELDS

(71) Applicant: Raytheon Company, Waltham, MA (US)

(72) Inventor: Kenneth A. Essenwanger, Buena Park, CA (US)

(73) Assignee: Raytheon Company, Waltham, MA (US)

( * ) Notice: Subject to any disclaimer, the term of this patent is extended or adjusted under 35 U.S.C. 154(b) by 0 days.

(21) Appl. No.: 13/774,026

(22) Filed: Feb. 22, 2013

(65) Prior Publication Data

US 2013/0162366 A1 Jun. 27, 2013

Related U.S. Application Data

(63) Continuation-in-part of application No. 13/610,258, filed on Sep. 11, 2012, now Pat. No. 8,471,646, which is a continuation of application No. 13/157,623, filed on Jun. 10, 2011, now Pat. No. 8,283,991.

(51) Int. Cl.
*H03H 7/42* (2006.01)
*H01P 3/08* (2006.01)

(52) U.S. Cl.
USPC .......................................... 333/26; 333/238

(58) Field of Classification Search
USPC .......................................... 333/25, 26, 238
See application file for complete search history.

(56) References Cited

U.S. PATENT DOCUMENTS

| | | | |
|---|---|---|---|
| 3,896,400 | A | 7/1975 | Hyde |
| 3,976,959 | A | 8/1976 | Gaspari |
| 5,523,728 | A | 6/1996 | McCorkle |
| 5,534,830 | A | 7/1996 | Ralph |
| 6,501,433 | B2 | 12/2002 | Popa et al. |
| 6,750,752 | B2 | 6/2004 | Werlau |

(Continued)

FOREIGN PATENT DOCUMENTS

WO 2008/018230 A1 2/2008

OTHER PUBLICATIONS

Chang et al.; "Ultrawide-Band Transitions and New Microwave Components Using Double-Sided Parallel-Strip Lines"; IEEE Transactions on Microwave Theory and Techniques; Sep. 1, 2004; pp. 2148-2152; vol. 52, No. 9; IEEE Service Center; Piscataway, NJ, US.

(Continued)

*Primary Examiner* — Dean O Takaoka
(74) *Attorney, Agent, or Firm* — Pierce Atwood LLP; Joseph M. Maraia

(57) ABSTRACT

Provided are assemblies and processes for efficiently coupling wideband differential signals between balanced and unbalanced circuits. The assemblies include a broadband balun having an unbalanced transmission line portion, a balanced transmission line portion, and a transition region disposed between the unbalanced and balanced transmission line portions. The unbalanced transmission line portion includes at least one ground and a pair of conductive signal traces, each isolated from ground. The balanced portion does not include an analog ground. The transition region effectively terminates the analog ground, while also smoothly transitioning or otherwise shaping transverse electric field distributions between the balanced and unbalanced portions. Beneficially, the balun is free from resonant features that would otherwise limit operating bandwidth, allowing it to operate over a wide bandwidth of 10:1 or greater. Assemblies can include RF chokes with back-to-back baluns, and other elements, such as balanced filters, and also can be implemented as integrated circuits.

15 Claims, 19 Drawing Sheets

(56) References Cited

U.S. PATENT DOCUMENTS

| | | | |
|---|---|---|---|
| 6,891,446 | B2 | 5/2005 | Tayrani et al. |
| 6,946,880 | B2 | 9/2005 | Essenwanger |
| 7,187,251 | B2 | 3/2007 | Chirala et al. |
| 7,265,644 | B2 | 9/2007 | Floyd et al. |
| 7,449,975 | B2 | 11/2008 | Hoover |
| 7,772,941 | B2 | 8/2010 | Yeung et al. |
| 8,063,715 | B2 | 11/2011 | Sasaki |
| 8,174,336 | B2 | 5/2012 | Kim et al. |
| 8,283,991 | B1 | 10/2012 | Essenwanger |
| 2002/0196096 | A1 | 12/2002 | Tajima |
| 2010/0007568 | A1 | 1/2010 | Fear et al. |

OTHER PUBLICATIONS

Chen et al.; "Double-Sided Parallel-Strip Line With an Inserted Conductor Plane and Its Applications"; IEEE Transactions on Microwave Theory and Techniques; Sep. 1, 2007; pp. 1899-1904; vol. 55, No. 9; IEEE Service Center; Piscataway, NJ, US.

EM-Wise Communications; "Ultra-Waveband Components"; 3 pages; [Downloaded from Internet—http://www.em-wise.com/eproduct.html] (2007) [Abstract].

Extended European Search Report for Application No. EP 12 16 3622; mailed Sep. 24, 2012.

Goverdhanam et al.; "Coplanar Stripline Propagation Characteristics and Bandpass Filter"; IEEE Microwave and Guided Wave Letters; 7(8):214-216 (Aug. 1997).

Goverdhanam et al.; "Micro-Coplanar Striplines—New Transmission Media for Microwave Applictions"; IEEE MTT-S Digest; WEIF-67; pp. 1035-1038; Ann Arbor, MI, US (1998).

Kim et al.; "An Ultra-Wideband Microstrip-to-CPW Transition"; IEEE MTT-S International Microwave Symposium; pp. 1079-1082; Bokhyun-dong, Daegu, Korea (2008).

Kim et al.; "Keynote Address VI: A New Ultra-Wideband Balun and its Associated Components"; 11th IEEE International Conference on Communication Technology (2008)[Abstract].

Paul; "Introduction to Electromagnetic Compatibility—Second Edition"; John Wiley & Sons, Inc. [ISBN: 0-471-54927-4](1992)[Abstract].

Ponchak et al.; "A New Model for Broadband Waveguide to Microstrip Transition Design"; NASA Technical Memorandum 88905; pp. 1-18; Cleveland, OH, US (Dec. 1986).

Shi et al.; "A Differential Voltage-Controlled Integrated Antenna Oscillator Based on Double-Sided Parallel-Strip Line"; IEEE Transactions on Microwave Theory and Techniques; Oct. 1, 2008; pp. 2207-2212; vol. 56, No. 10; IEEE Service Center; Piscataway, NJ, US.

Wambacq et al.; "Distortion Analysis of Analog Integrated Circuits" 1998, pp. 15-16, Kluwer Academic Publishers, Norwell, MA, USA [ISBN: 0792381866].

Gupta, K.C. et al.: "Microstrip Lines and Slotlines" 1996, pp. 270-291, Artech House, Inc., Norwood, MA, USA [ISBN: 0-89006-766].

Archambeault:; "Electromagnetic Band Gap Structure for Common Mode Filtering of High Speed Differential Signals", Jun. 2011, pp. 1-56, IEEE Fellow, IBM Distinguished Engineer.

WIDEBAND, DIFFERENTIAL SIGNAL BALUN FOR REJECTING COMMON MODE ELECTROMAGNETIC FIELDS

CROSS REFERENCE TO RELATED APPLICATION

The present application is a Continuation In Part of U.S. patent application Ser. No. 13/610,258, filed on Sep. 11, 2012 which is a Continuation of U.S. Pat. No. 8,283,991, issued on Oct. 9, 2012. The entire content of the above applications is incorporated herein by reference.

TECHNICAL FIELD

Various embodiments are described herein relating generally to the field of microwave and RF circuits and the like, and more particularly to baluns used in such circuits.

BACKGROUND

Transmission of a signal over a differential transmission line reduces the influence of noise or interference due to external stray electric fields. Any external signal sources tend to induce only a common mode signal on the transmission line and the balanced impedances to ground minimizes differential pickup due to stray electric fields. A differential transmission line allows a differential receiver to reduce the noise on a connection by rejecting common-mode interference. The transmission lines have the same impedance to ground, so the interfering fields or currents induce the same voltage in both wires. Use of such balanced circuits for differential signals, however, has generally been applied at lower frequencies.

A circuit element referred to as a balun is generally used to convert unbalanced transmission line inputs into one or more balanced transmission line outputs or vice versa. Baluns operating at low-frequency bands generally consist of a concentrated, constant component such as a transformer. Such low-frequency baluns often leverage ferrite and air coil transformer technology to achieve high performance and very broad bandwidth.

Trends in electronics, however, are generally toward ever increasing operational frequencies and bandwidths. Thus, baluns are being employed in various demanding applications often requiring high-frequency and/or wideband operation. For example, baluns are being incorporated in output stages of delta-sigma modulator direct digital synthesizers, Digital-to-Analog Converters (DACs), Analog-to-Digital Converters (ADCs), differential digital signaling, RF mixers, SAW filters, and antenna feeds. Such applications demand miniature, wide-bandwidth (wideband) baluns compatible with integrated circuits and capable of rejecting common mode energy from differential inputs or providing differential outputs lacking common mode energy.

At radio-wave frequencies (e.g., microwave) and higher it becomes increasingly difficult to fabricate broadband baluns having ferrite and air coil transformer, necessitating other techniques. Baluns that operate at such high-frequency bands generally consist of a distributed, constant component. Since most of these baluns each of which consists of a distributed, constant component include a quarter-wavelength matching element or are transformers whose size is determined according to usable wavelengths, a disadvantage to them is that their frequency bands are fundamentally narrow. Moreover, such high frequency signals (e.g., RF, microwave, millimeter wave) typically rely on single-ended and unbalanced anti-phase signals, rather than balanced differential signals. Namely, a signal is driven with reference to a ground. Such single-ended signals may be beneficial in controlling electromagnetic interference (consider high-frequency transmission lines, such as coaxial cable, in which an outer conductor is grounded). Unfortunately, such structures are not well suited to accommodate balanced differential signals, which are necessarily isolated from ground.

SUMMARY

Described herein are embodiments of systems and techniques for coupling differential signals between unbalanced transmission lines and balanced transmission lines using balun structures supporting ultra-wideband operation. In at least some embodiments, the coupling is accomplished for at least one of microwave and millimeter wave operating ranges.

In one aspect, at least one embodiment described herein provides a broadband balun including an unbalanced transmission line portion, a balanced transmission line portion, and a transition region disposed between the unbalanced transmission line portion and the balanced transmission line portion. The unbalanced transmission line portion includes a first in-phase trace extending along a longitudinal axis, a first anti-phase trace extending parallel to the first trace, and at least one ground plane parallel to, electromagnetically coupled with, and physically isolated from each of the first in-phase and anti-phase traces. The balanced transmission line portion includes a second in-phase trace and a second anti-phase trace. The second in-phase trace is in electrical communication with the first in-phase trace and a second anti-phase trace in electrical communication with first anti-phase trace. Further, each of the second in-phase and anti-phase traces is vertically parallel (broadside) with its respective first in-phase and anti-phase traces, while also being substantially uncoupled to the at least one ground plane.

In some embodiments, at least one ground plane is disposed between the first in-phase trace and the first anti-phase trace. Consequently, each of the in-phase and anti-phase traces together with an adjacent side of the at least one ground plane forms a respective microstrip waveguide. More generally, the unbalanced transmission line portion can be one of: a microstrip waveguide; a coplanar stripline; a parallel plate stripline; a finite-ground coplanar waveguide (FGCPW); a coplanar waveguide; a coplanar stripline; an asymmetric stripline; and a slot line. In at least some embodiments, the unbalanced and balanced transmission lines are capable of at least one of millimeter wave transmission and microwave transmission.

In some embodiments, each of the microstrip transmission lines has a respective first characteristic impedance, the characteristic impedances being substantially equal. Additionally, the balanced transmission line portion has a second characteristic impedance, which is approximately twice that of either first characteristic impedance.

The transition region includes a respective terminal edge defining a boundary of each of the at least one ground planes between the unbalanced and balanced transmission line portions. A ground plane edge variation is also provided, extending along the longitudinal axis for a predetermined length measured from the respective terminal edge. Additionally, respective cross sections of each of the unbalanced, balanced and transition regions are substantially symmetric with respect to the longitudinal axis. In some embodiments, the ground plane edge variation defines a tapered extension of the ground plane extending away from the unbalanced transmission line portion with a narrow end directed towards the balanced transmission line portion.

In some embodiments, each of the unbalanced transmission line portion, the balanced transmission line portion and the transition region are incorporated into an integrated circuit. The integrated circuit can be implemented according to any suitable integrated circuit device technologies, for example, being selected from the group consisting of: Si; Ge; III-V semiconductor; GaAs, and SiGe; and combinations thereof.

In some embodiments, the balun can be combined with or otherwise adapted to include a differential filter. For example, such a differential filter can be coupled to an end of the balanced transmission line portion opposite the transition region.

Alternatively or in addition, the balun can be combined with or otherwise adapted to include a second broadband balun of similar construction. When so configured, the baluns are coupled together along their respective balanced transmission line portions, in a back-to-back configuration.

In another aspect, at least one embodiment described herein relates to a process for efficiently coupling differential signals between an unbalanced differential transmission line and a balanced differential transmission line. In particular, the unbalanced differential transmission line has at least one analog ground reference; whereas, the balanced differential transmission line does not have any such analog ground reference. The process includes receiving electromagnetic energy by way of a propagating transverse electromagnetic (TEM) wave from one of the unbalanced and the balanced differential transmission lines. The TEM wave has a first transverse electric field distribution, which is symmetric about an axial centerline. The received electromagnetic energy is transferred to the other one of the unbalanced and the balanced differential transmission lines (i.e., unbalanced-to-balanced or balanced-to-unbalanced). The TEM wave, likewise, has a second transverse electric field distribution, which is also symmetric about an axial centerline. The process further includes symmetrically reconfiguring the first electromagnetic field distribution to conform to the second electromagnetic field distribution. Such symmetric reconfiguration is accomplished along a transition region disposed between the unbalanced and balanced differential transmission lines. The reconfiguration minimizes reflection of electromagnetic energy over a bandwidth of at least 10:1, for electromagnetic energy including at least one of a millimeter wave transmission and a microwave transmission.

Symmetrically reconfiguring can be accomplished gradually along the axial centerline. In some embodiments, the act of symmetrically reconfiguring is accomplished by way of interaction of the TEM wave with at least one analog ground along the transition region. For example, symmetrically reconfiguring can be accomplished by shaping the transverse electric field distribution by way of a longitudinal taper in the at least one analog ground reference.

In yet another aspect, at least one embodiment described herein provides a broadband balun including an unbalanced transmission line portion, a balanced transmission line portion, and a transition region disposed between the unbalanced and the balanced transmission line portions. The broadband balun includes means for receiving electromagnetic energy by way of a propagating transverse electromagnetic (TEM) wave or Quasi-TEM wave from one of the unbalanced differential transmission line and the balanced differential transmission line. The TEM wave has a first transverse electric field distribution, which is symmetric about an axial centerline. The balun also includes means for transferring the received electromagnetic energy to the other one of the unbalanced differential transmission line and a balanced differential transmission line. The TEM wave has a second transverse electric field distribution, which is also symmetric about the axial centerline. Still further, the balun includes means for symmetrically reconfiguring the first electromagnetic field distribution to conform to the second electromagnetic field distribution. The reconfiguring means are disposed along a transition region between the unbalanced and balanced differential transmission lines. The reconfiguring means minimizes reflection of the electromagnetic energy over a bandwidth of at least about 10:1.

In one aspect, at least one embodiment described herein provides an electrical system. The electrical system includes at least one ground plane defining one or more apertures; and a broadband balun. The broadband balun includes an unbalanced transmission line portion, including a first in-phase trace extending along a longitudinal axis, a first anti-phase trace extending parallel to the first in-phase trace, and the at least one ground plane parallel to, electromagnetically coupled with, and physically isolated from each of the first in-phase and anti-phase traces; a balanced transmission line portion, the balanced transmission line portion including a second in-phase trace in electrical communication with the first in-phase trace, and a second anti-phase trace in electrical communication with the first anti-phase trace, each of the second in-phase and anti-phase traces being vertically broadside with its respective first in-phase and anti-phase traces and substantially uncoupled to the at least one ground plane, wherein at least a portion of the one or more apertures defined by the at least one ground plane is positioned at least one of between, above, or below the second in-phase trace and the second anti-phase trace, a transition region disposed between the unbalanced transmission line portion and the balanced transmission line portion, the transition region comprising a respective terminal edge defining a boundary of each of the at least one ground planes between the unbalanced and balanced transmission line portions and a ground plane edge variation extending along the longitudinal axis for a predetermined length measured from the respective terminal edge, wherein respective cross sections of each of the unbalanced, balanced and transition regions are substantially symmetric with respect to the longitudinal axis.

Any of the aspects and/or embodiments described herein can include one or more of the following embodiments. In some embodiments at least one aperture of the one or more apertures defined by the at least one ground plane is oriented perpendicularly to a propagation direction of the broadband balun. In some embodiments the at least one aperture includes a slotline portion having a width, a first length and a second length; and at least one slotline-open portion. In some embodiments the slotline-open portion includes an open taper extending from the slotline portion at an open angle of 0-180 degrees, and; an end region adjacent the open taper opposite the slotline portion.

In some embodiments the electrical system includes a second broadband balun of similar construction, having a balanced transmission line portion coupled to the balanced transmission line portion of the broadband balun, in a back-to-back configuration. In some embodiments the minimum width of the slotline portion is greater than a minimum width required for $Z_{OS}=2Z_{OB}$ and less than a quarter-wavelength of a maximum operating frequency of the electrical system, wherein $Z_{OS}$ is a slotline impedance, $Z_{OB}$ is an impedance minimum of the balanced transmission line portion, and the width of the slotline portion is related to $Z_{OS}$ according to at least one of a Transverse Resonance Method, Galerkin's Method, or Cohn's Numerical Method.

In some embodiments the first length of the slotline portion extends from a first side of the broadband balun and the second length of the slotline portion extends from a second side of the broadband balun, further wherein each of the first length and the second length is greater than or equal to a thickness (h) of dielectric material when W/h<0.5 and greater than or equal to zero when W/h>=0.5 between the second in-phase trace and the second anti-phase trace and less than a quarter-wavelength of a maximum operating frequency of the electrical system. In some embodiments the electrical system includes a differential filter coupled to an end of the balanced transmission line portion opposite the transition region; and a second balun configured to transition a balanced, filtered output of the differential filter to a second unbalanced transmission line portion.

In some embodiments the width of the slotline portion between the transition region and the differential filter is greater than a minimum width required for $Z_{OS}=2Z_{OS}$ and less than a quarter-wavelength of a maximum operating frequency of the electrical system, wherein $Z_{OS}$ is a slotline impedance, $Z_{OB}$ is an impedance minimum of the balanced transmission line portion, and the width of the slotline portion is related to $Z_{OS}$ according to at least one of a Transverse Resonance Method, Galerkin's Method, or Cohn's Numerical Method. In some embodiments the open taper includes an open angle of 60-110 degrees. In some embodiments the end region is a flat end. In some embodiments the end region is open. In some embodiments the end region is semi-circular. In some embodiments the semi-circular end region has a radius greater than a quarter-wavelength of the maximum operating frequency of the electrical system and less than a wavelength of the lowest operating frequency of the electrical system.

In some embodiments at least one of the one or more apertures defined by the at least one ground plane is oriented perpendicularly to the broadband balun. In some embodiments the at least one of the one or more apertures includes a slotline portion having a width and a length; and at least one slotline-open portion. In some embodiments the at least one slotline open portion includes a circle extending from the slotline portion. In some embodiments the second in-phase trace is vertically aligned with the second anti-phase trace. In some embodiments the second in-phase trace is vertically offset from the second anti-phase trace.

BRIEF DESCRIPTION OF THE DRAWINGS

The foregoing and other objects, features and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION

A description of embodiments of systems and processes for interconnecting unbalanced and balanced structures adapted for carrying differential signals over a substantially wide bandwidth follows. More particularly, travelling wave structures without elements resonant at any particular frequency, are arranged along a central, longitudinal axis, having in-phase and anti-phase conductive traces configured to collectively support the transfer of differential signals. The travelling wave structures can include transmission lines, otherwise referred to as waveguide sections, configured as parallel-plate waveguides, co-planar waveguides, microstrip waveguides and differential stripline waveguides, including parallel-plate and co-planar stripline waveguides. The structures are referred to as baluns and can accommodate efficient transfer of differential signals in either direction (e.g., from unbalanced to balanced and from balanced to unbalanced), with minimal reflections or other reductions in signal integrity.

The baluns include an unbalanced portion having at least one analog or digital ground herein generally referred to as ground. The ground is physically isolated (i.e., no direct-current path) from either the in-phase or anti-phase traces. At non-zero frequencies, however, the traces and ground together support common mode signals along the differential signal traces. Such common mode signals are sometimes referred to as even mode signals. The at least one analog ground is substantially removed, or otherwise isolated from the differential signal traces in the balanced portion. The transition from ground to no-ground occurs in the transition region. Consequently, common mode signals are no longer supported along the balanced portion as an effective common mode impedance measured between either trace and the at least one analog ground approaches an open circuit (i.e., infinite impedance). The differential signal traces, however, remain capable of supporting differential mode propagation. Such differential mode signals without common mode signals represents a balanced configuration.

Figure 1:
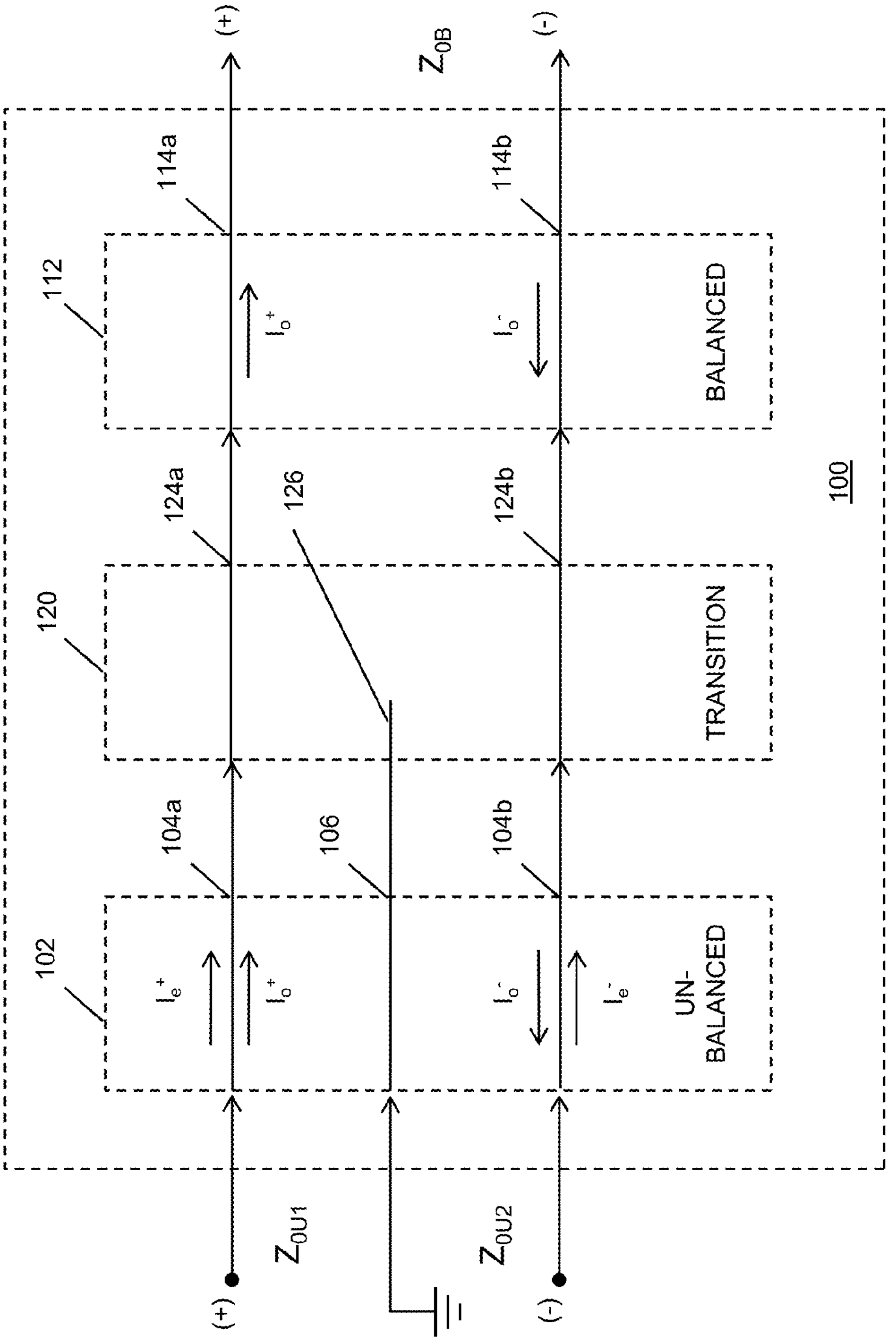
FIG. 1 illustrates a schematic diagram of an embodiment of a broadband balun.

A schematic diagram of an embodiment of a broadband, differential-signal balun 100 is illustrated in FIG. 1. The balun 100 includes an unbalanced portion 102 having an in-phase signal trace 104*a*, an anti-phase signal trace 104*b*, and at least one analog ground 106. The in-phase 104*a* trace, the anti-phase 104*b* trace and the at least one ground 106 are collectively configured to support at least one propagating waveguide mode. For example, a first waveguide may include the in-phase trace 104*a* and the analog ground 106, having a first characteristic impedance $Z_{OU1}$. Likewise, a second waveguide may include the anti-phase trace 104*b* and the analog ground 106, having a second characteristic impedance $Z_{OU2}$. In at least some embodiments, the first and second characteristic impedances are substantially identical: i.e., $Z_{OU1}=Z_{OU2}=Z_{OU}$.

The unbalanced portion 102 can be considered unbalanced at least in that the currents on either the in-phase or anti-phase traces 104*a*, 104*b* interact with the analog ground 106. As such, the unbalanced portion 102 is capable of supporting oppositely directed currents, sometimes referred to as differential mode, on the in-phase and anti-phase traces 104*a*, 104*b* (i.e., $I_o^+$, $I_o^-$), having a respective odd mode impedance with respect to each other. Additionally, the unbalanced portion 102 is capable of supporting co-aligned currents, sometimes referred to as a common mode, on the in-phase and anti-phase traces 104*a*, 104*b* (i.e., $I_e^+$, $I_e^-$), having an even mode impedance with respect to the analog ground 106.

The balun 100 also includes a balanced portion 112 having an in-phase signal trace 114*a* and an anti-phase signal trace 114*b*, without any analog ground reference. The in-phase 114*a* trace and the anti-phase 114*b* trace are arranged as a balanced waveguide capable of supporting a balanced propagating waveguide mode. The balanced waveguide is formed by the traces 114*a*, 114*b*, having a respective characteristic impedance $Z_{OB}$. The in-phase signal trace 114*a* is in electrical communication with the in-phase trace 104*a* of the unbalanced portion 102. Likewise, the anti-phase signal trace 114*b* is in electrical communication with the anti-phase trace 104*b* of the unbalanced portion 102. The structure can be considered balanced at least in that the currents on either the in-phase or anti-phase traces 104*a*, 104*b* are substantially equal and opposite (i.e., $I_o^+$, $I_o^-$). The aligned currents on the in-phase and anti-phase traces 104*a*, 104*b* (i.e., $I_e^+$, $I_e^-$), having an even mode impedance with respect to the analog ground 106.

The balun 100 also includes a transition region 120 having an in-phase signal trace 124*a* and an anti-phase signal trace 124*b*. The in-phase 124*a* trace and the anti-phase 124*b* trace are arranged as a waveguide capable of supporting a propagating waveguide mode. The in-phase signal trace 124*a* is in electrical communication between the in-phase trace 104*a* of the unbalanced portion 102 and the in-phase trace 114*a* of the balanced portion 112. Likewise, the anti-phase signal trace 124*b* is in electrical communication between the in-phase trace 104*b* of the unbalanced portion 102 and the in-phase trace 114*b* of the balanced portion 112. The transition region 120 also includes a partial analog ground 126 in electrical communication with the analog ground 106 of the unbalanced portion 102.

Figure 2A:
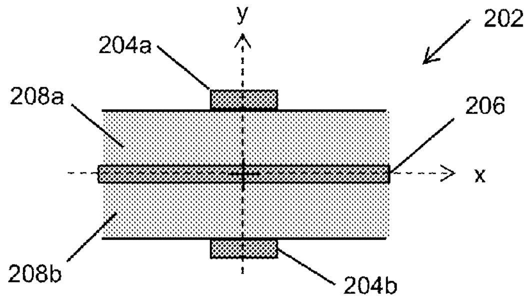
FIG. 2A and FIG. 2B respectively illustrate cross sections of an example of an unbalanced portion and a balanced portion of the broadband balun shown in FIG. 1.

Referring next to FIG. 2A, a cross section of an example of an unbalanced portion 202 of the broadband balun 100 is shown. The unbalanced portion 202 includes an in-phase trace 204*a*, an anti-phase trace 204*b* and an analog ground 206. In this example, the analog ground 206 is provided as a ground plane 206. An upper dielectric layer 208*a* abuts a top surface of the analog ground plane 206 and a lower dielectric layer 208*b* abuts a bottom surface of the ground plane 206. The in-phase trace 204*a* extends along a top surface of an upper dielectric layer 208*a*, opposite the top surface of the analog ground plane 206. The anti-phase trace 204*b* extends along a bottom surface of the lower dielectric layer 208*b*, opposite the bottom surface of the analog ground plane 206. In at least some embodiments, the in-phase and anti-phase traces 204*a*, 204*b* are substantially uniform in cross section, extending parallel to a central, longitudinal axis.

Figure 2B:
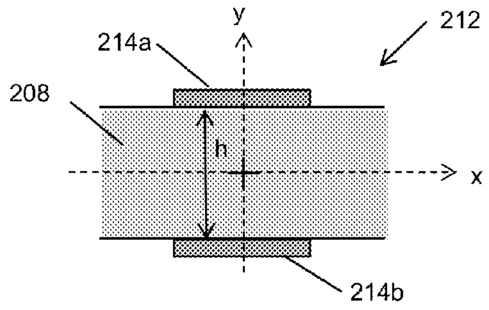

A cross section of an example of a balanced portion 212 of the broadband balun 100 is shown in FIG. 2B. In particular, the balanced portion 212 corresponds to a balun having an unbalanced portion 202 as shown in FIG. 2A. The balanced portion 212 includes an in-phase trace 214*a* and an anti-phase trace 214*b*. A planar dielectric layer 208 extends between the in-phase trace 214*a* and the anti-phase trace 214*b*, with in-phase trace 204*a* extending along a top surface of the dielectric layer 208, and the anti-phase trace 204*b* extending along a bottom surface of the dielectric layer 208 and without the analog ground plane 206. In at least some embodiments, the in-phase and anti-phase traces 214*a*, 214*b* are substantially uniform in cross section extending parallel to the central, longitudinal axis of the balun 100. Thus, each of the in-phase and anti-phase traces 214*a*, 214*b* is vertically parallel (referred to as vertically broadside) with its respective first in-phase and anti-phase traces, while also being substantially uncoupled to the at least one ground plane. As shown in FIG. 2B, h is a thickness of the planar dielectric layer 208 between in-phase and anti-phase traces 214*a* and 214*b*.

With respect to the unbalanced portion 202, the in-phase trace 204*a*, the upper dielectric layer 208*a* and the ground plane 206 represent a first microstrip waveguide. The first microstrip waveguide can be driven by an in-phase portion of a differential signal (not shown). Likewise, the anti-phase trace 204*b*, the lower dielectric layer 208*b* and the ground plane 206 also represent a second microstrip waveguide. The second microstrip waveguide can be driven by an anti-phase portion of the differential signal. Reference x and y coordinate axes are illustrated for each of the transverse cross-sections, having an origin coincident with the central, longitudinal axis of the balun 100. Each of the traces 204*a*, 204*b* has a respective width ($w_U$), measured along the x-axis, a thickness ($t_U$) measured along the y-axis and a height ($h_U$) above the ground plane 206 also measured along the y-axis. The first and second microstrip waveguides have respective characteristic impedances $Z_{OU1}$, $Z_{OU2}$, each of which that can be determined through techniques known to those skilled in the art of waveguide design, according to respective dimensions $w_U$, $t_U$, $h_U$ and a dielectric constant ($\in_r$) of the dielectric layer 208. It is apparent that the unbalanced portion 202 exhibits a high degree of symmetry, being symmetric with respect to each of the x and y axes, described herein as being symmetric with respect to the central, longitudinal axis.

With respect to the balanced portion 212, the in phase trace 214*a* and the anti-phase trace 214*b* represent a parallel plate waveguide. The traces 214*a*, 214*b* have respective widths ($w_B$), measured along the x-axis, thicknesses ($t_B$) measured along the y-axis and height ($h_B$) with respect to each other also measured along the y-axis. The parallel plate waveguide has a respective characteristic impedance $Z_{OB}$, which can also be determined through generally known techniques according to respective dimensions $w_B$, $t_B$, $h_B$ and a dielectric constant ($\in_r$) of the dielectric layer 208. It is apparent that the balanced portion 212 also exhibits a high degree of symmetry, being symmetric with respect to each of the x and y axes (i.e., symmetric with respect to the central, longitudinal axis).

Figure 3A:
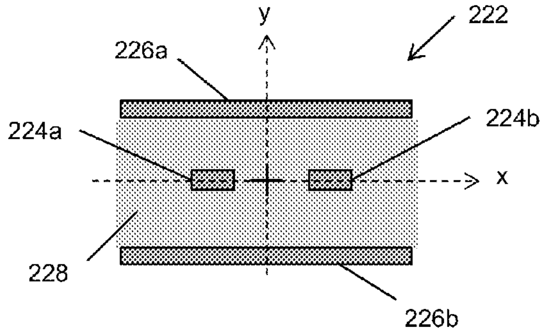
FIG. 3A and FIG. 3B respectively illustrate cross sections of another example of an unbalanced portion and a balanced portion of the broadband balun shown in FIG. 1.

A cross section of another example of an unbalanced portion 222 of the broadband balun 100 is shown in FIG. 3A. The unbalanced portion 222 includes an in-phase trace 224*a* and an anti-phase trace 224*b* extending along a longitudinal axis of the balun 100, between an upper analog ground 226*a* and a lower analog ground plane 226*b*. A dielectric layer 228 extends between the upper and lower analog ground plane layers 226*a*, 226*b*, with the in-phase and anti-phase traces 224*a*, 224*b* embedded within a dielectric layer 228. In at least some embodiments, the in-phase and anti-phase traces 224*a*, 224*b* (generally 224) are substantially uniform in cross section extending parallel to the longitudinal axis. It is envisioned that the dielectric layer may include multiple layers, for example two layers, one above and one below the traces 224.

Figure 3B:
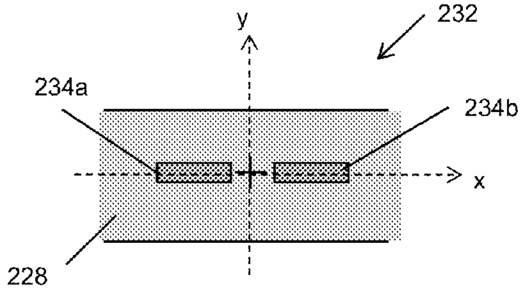

A cross section of another example of a balanced portion 232 of the broadband balun 100 is shown in FIG. 3B. In particular, the balanced portion 232 corresponds to a balun having an unbalanced portion 222 as shown in FIG. 3A. The balanced portion 232 includes an in-phase trace 234*a* and an anti-phase trace 234*b* embedded within the planar dielectric layer 228 and without either of the upper or lower analog ground planes 226*a*, 226*b*. In at least some embodiments, the in-phase and anti-phase traces 234*a*, 234*b* are substantially uniform in cross section extending parallel to the longitudinal axis of the balun 100.

With respect to the unbalanced portion 222, the in-phase trace 224*a*, the anti-phase trace 224*b* and the upper and lower ground planes 226*a*, 226*b* represent a co-planar, stripline waveguide. The in-phase trace 224*a*, the anti-phase trace 224*b* can be driven by a differential signal source (not shown). Reference x and y coordinate axes are illustrated for the transverse cross-section, having an origin coincident with the longitudinal axis of the balun 100. Each of the traces 224*a*, 224*b* has a respective width ($w_U$) and spacing ($s_U$), measured along the x-axis, a thickness ($t_U$) measured along the y-axis and a uniform height ($h_U$) with respect to either ground plane 226*a*, 226*b* also measured along the y-axis. The co-planar, stripline waveguide has a characteristic impedance $Z_{OU}$, which can be determined according to respective dimensions $w_U$, $s_U$, $t_U$, $h_U$ and a dielectric constant ($\in_r$) of the dielectric layer 228. It is apparent that the unbalanced portion 222 exhibits a high degree of symmetry, being symmetric with respect to each of the x and y axes.

With respect to the balanced portion 232, the in phase trace 234*a* and the anti-phase trace 234*b* represent a co-planar waveguide. The traces 234*a*, 234*b* have respective widths ($w_B$) and spacing ($s_U$), measured along the x-axis, and thicknesses ($t_B$) measured along the y-axis. The a co-planar waveguide has a respective characteristic impedance $Z_{OB}$, which can also be determined according to respective dimensions $w_B$, $t_B$ and a dielectric constant ($\in_r$) of the dielectric layer 228. It is apparent that the balanced portion 232 also exhibits a high degree of symmetry, being symmetric with respect to each of the x and y axes.

Figure 4A:
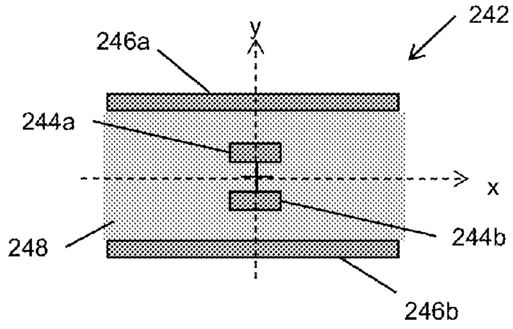
FIG. 4A and FIG. 4B respectively illustrate cross sections of yet another example of an unbalanced portion and a balanced portion of the broadband balun shown in FIG. 1.

A cross section of yet another example of an unbalanced portion 242 of the broadband balun 100 is shown in FIG. 4A. The unbalanced portion 242 includes an in-phase trace 244*a* and an anti-phase trace 244*b* extending along a longitudinal axis of the balun 100, between upper and lower analog ground planes 246*a*, 246*b*. A dielectric layer 248 extends between the upper and lower analog ground planes 246*a*, 246*b*, with the in-phase and anti-phase traces 244*a*, 244*b* embedded within the dielectric layer 248. In at least some embodiments, the in-phase and anti-phase traces 244*a*, 244*b* (generally 244) are substantially uniform in cross section extending parallel to a longitudinal axis. It is envisioned that the dielectric layer may be formed as multiple layers, for example two layers, one above, one below, and perhaps one between the traces 244. In at least some embodiments a homogeneous dielectric extends above 246*a* and below 246*b* (not shown).

Figure 4B:
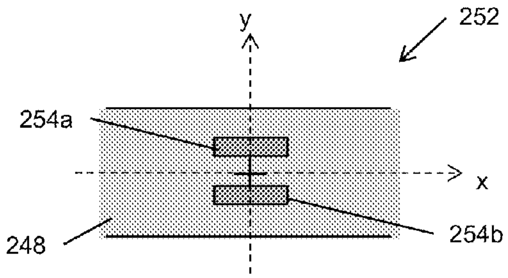

A cross section of yet another example of a balanced portion 252 of the broadband balun 100 is shown in FIG. 4B. In particular, the balanced portion 252 corresponds to a balun having an unbalanced portion 242 as shown in FIG. 4A. The balanced portion 252 includes an in-phase trace 254*a* and an anti-phase trace 254*b* embedded within the planar dielectric layer 248 and without either of the upper or lower analog ground planes 246*a*, 246*b*. In at least some embodiments, the in-phase and anti-phase traces 254*a*, 254*b* are substantially uniform in cross section extending parallel to a longitudinal axis.

With respect to the unbalanced portion 242, the in-phase trace 244*a*, the anti-phase trace 244*b* and the upper and lower ground planes 246*a*, 246*b* represent a parallel-plate, stripline waveguide. The in-phase trace 244*a*, the anti-phase trace 244*b* can be driven by a differential signal source (not shown). Reference x and y coordinate axes are illustrated for the transverse cross-section, having an origin coincident with the longitudinal axis of the balun 100. Each of the traces 244*a*, 244*b* has a respective width ($w_U$), measured along the x-axis, a thickness ($t_U$) and spacing ($s_U$), measured along the y-axis and a uniform height ($h_U$) with respect to each other measured along the y-axis. The parallel-plate, stripline waveguide has a characteristic impedance $Z_{OU}$, which can be determined according to respective dimensions $w_U$, $s_U$, $t_U$, $h_U$ and a dielectric constant ($\in_r$) of the dielectric layer 248. It is apparent that the unbalanced portion 242 exhibits a high degree of symmetry, being symmetric with respect to each of the x and y axes. In at least some embodiments the traces 244*a* and 244*b* are offset from each other in the x direction (plus and minus) for setting $Z_{OU}$ without having to adjust the spacing $s_U$ or heights $h_U$ (not shown).

With respect to the balanced portion 252, the in phase trace 254*a* and the anti-phase trace 254*b* represent a parallel-plate waveguide, embedded within the dielectric layer 248. The traces 254*a*, 254*b* have respective widths ($W_B$) and spacing ($s_B$), measured along the x-axis, thicknesses ($t_B$) and separation ($h_B$) measured along the y-axis. The parallel-plate waveguide has a respective characteristic impedance $Z_{OB}$, which can also be determined according to respective dimensions $w_B$, $t_B$, $h_B$ and a dielectric constant ($\in_r$) of the dielectric layer 248. It is apparent that the balanced portion 252 also exhibits a high degree of symmetry, being symmetric with respect to each of the x and y axes.

Figure 5A:
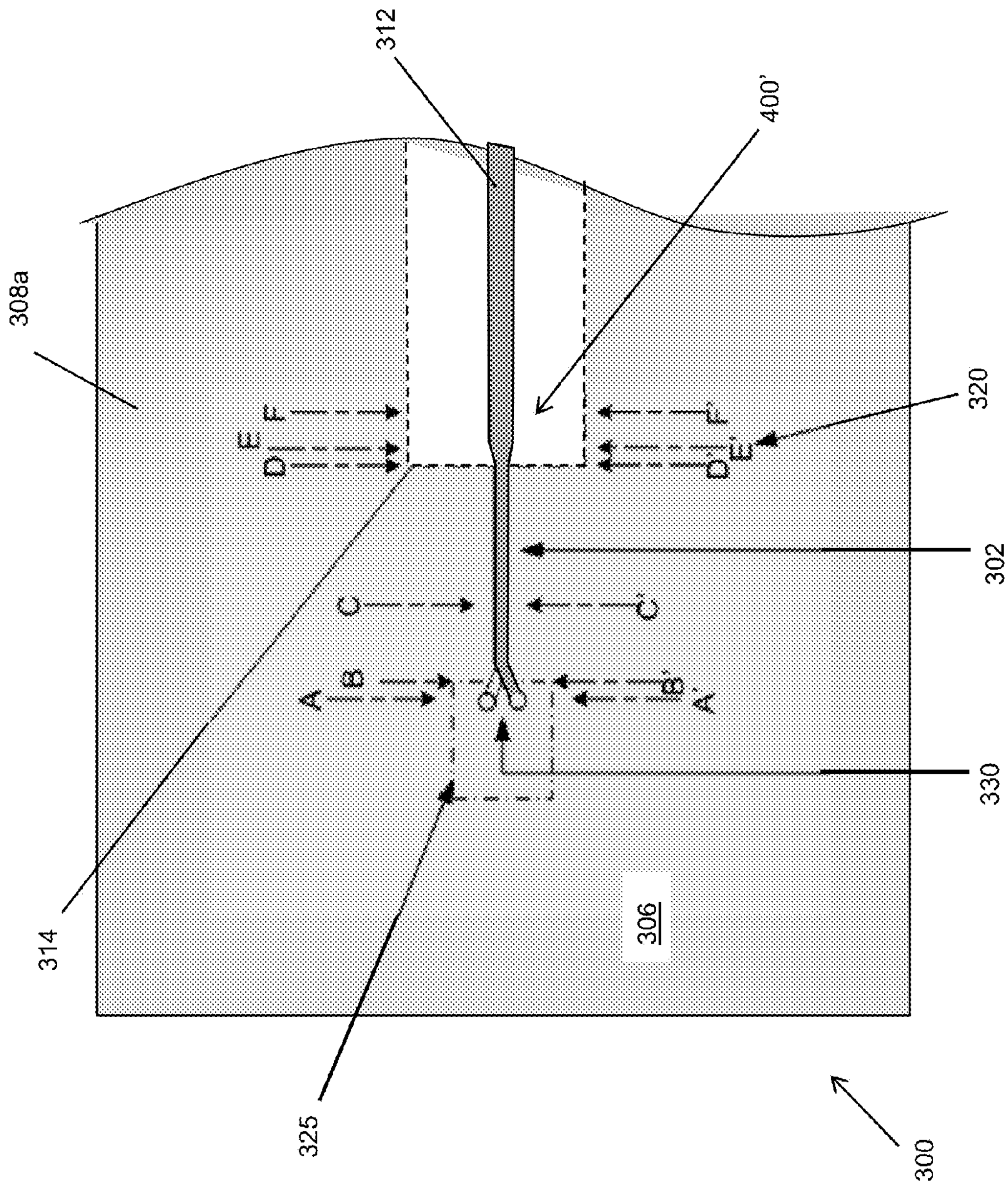
FIG. 5A and FIG. 5B respectively illustrate planar views of example broadband baluns with an unbalanced portion including opposing microstrip waveguides.

FIG. 5A illustrates a planar view of an example of a broadband balun 300 with an unbalanced portion 302 including opposing microstrip waveguides, for example, similar to those illustrated in FIG. 2A. An in-phase trace is visible above an upper dielectric layer 308*a*. Also shown as a shaded region is a top surface of a central ground plane 306, visible through the dielectric layer, which has been illustrated as translucent for this purpose. A balanced portion 312 is formed by removal of a portion of the ground plane 306 from between the in-phase and anti-phase traces. A perimeter of a ground plane aperture 314 is illustrated as a dashed line, indicating that it lies within the dielectric layer 308. As shown, it is not necessary that the entire ground plane 306 be removed within the balanced portion 312. Rather, the ground plane 308 is removed from between the parallel traces, the removal extending for some distance away from the traces, such that electromagnetic coupling to the ground plane (e.g., by way of a capacitance) is substantially negligible at a distance of at least 10 $s_B$. In at least some embodiments, a minimum separation between ground plane and traces is at least, e.g., 10 $s_B$.

A transition layer 320 is provided between the unbalanced portion 302 and the balanced portion 312. Also shown is a "footprint" 325 for a differential circuit as may be coupled to the balun 300. A differential signal interface 330 is provided within the vicinity of differential circuit footprint 325 and adapted for coupling to contacts of the differential circuit portrayed by its footprint 325. The differential circuit may be a signal source, for example including a differential driver, or a signal sink, for example including a differential receiver. Thus, signals may flow in either direction along the wideband balun 300, from the unbalanced portion to the balanced portion, and vice versa. In some embodiments, another differential circuit (not shown) can be coupled to an end of the balanced portion 312 opposite the transition region 320.

In various embodiments, it may be preferable to avoid electrical resonance (resonance) in an electrical system or device (e.g., one including a broadband balun 300) because resonance can be detrimental to the operation of a circuit. In particular, resonance may cause unwanted sustained and transient oscillations which may cause noise, signal distortion, and damage to circuit elements. It may also, in various embodiments, be preferable to prevent reflection of electromagnetic radiation because such reflection may lead to increased insertion loss through the circuit to the output of the broadband balun 300. Increased insertion loss is a measure of the loss of signal power resulting from the insertion of a device (e.g., broadband balun 300) into a transmission line or optical fiber. Insertion loss may be detrimental to various applications where maintaining high signal power is desirable. Imbalances in the current flow through a circuit can cause electrical resonance and insertion loss in the circuit. One source of imbalances can be geometric features in the circuit (e.g., dimensional features or particular shapes of electrical traces). For example, electrical traces that are not symmetric, or which have different lengths, can create imbalances in the circuit. Certain geometric features can therefore create an undesirable imbalance in the current flow through the circuit. Therefore, and as described with further detail below, designing or configuring electrical circuits such that they employ particular dimensions and shapes of the ground plane aperture 314 may be desirable to, for example, prevent slot resonances and/or prevent electromagnetic radiation (reflection) in a particular electrical system or application.

Figure 5B:
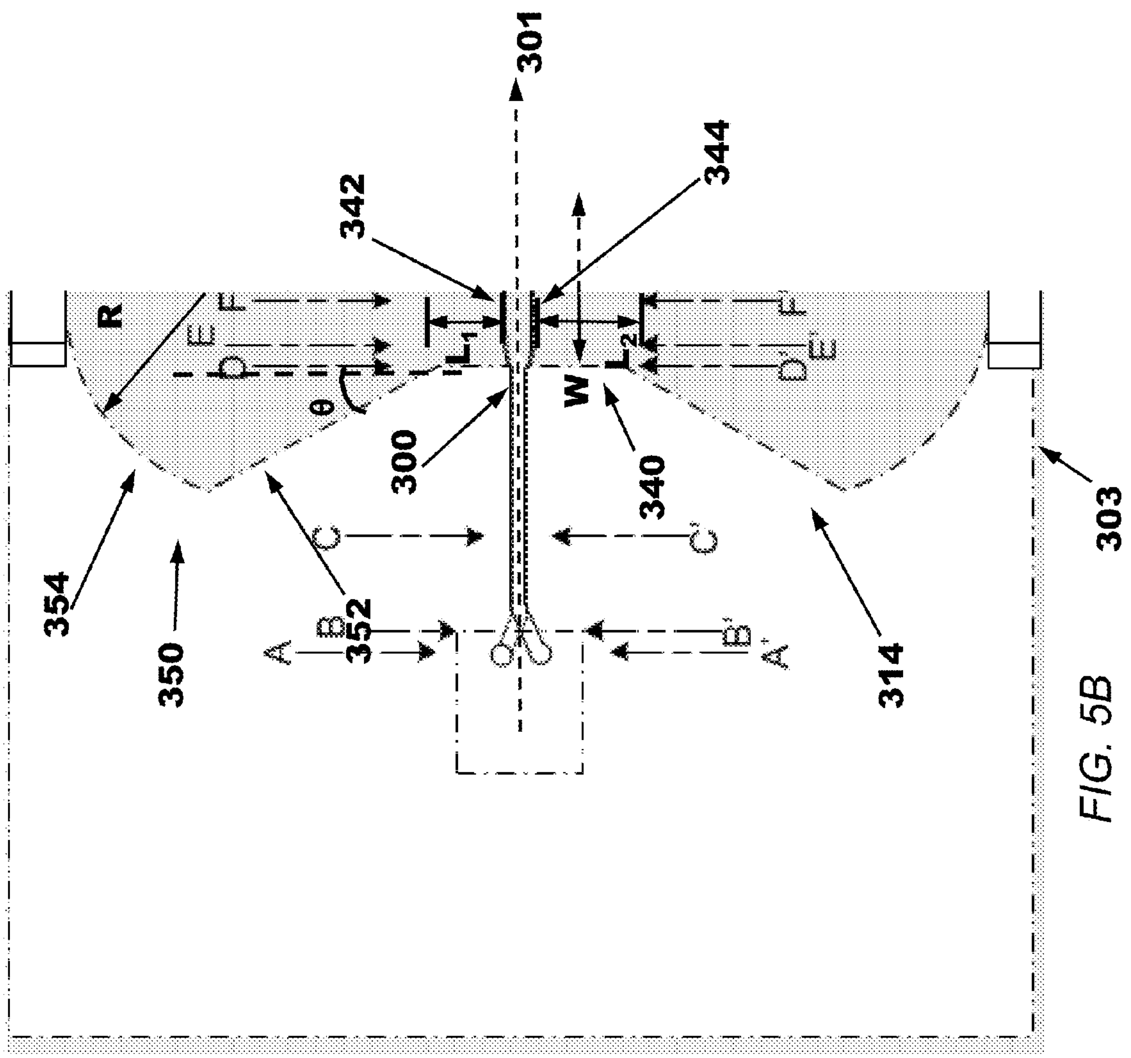

FIG. 5B illustrates an example ground plane aperture 314 in accordance with various embodiments of the present disclosure. As shown in FIG. 5B, the ground plane aperture 314 may be oriented perpendicularly to the propagation direction 301 of the broadband balun 300 and may include a slotline portion 340 and a slotline open portion 350, which may include an open taper section 352 and/or an end region 354.

The slotline portion 340 has a width W (shown as a partial width in FIG. 5B and as a full-width in FIG. 13B), and two lengths ($L_1$, $L_2$), wherein distances $L_1$ and $L_2$ extend perpendicularly to the propagation direction 301 beyond each of a first side 342 and a second side 344 respectively of the balanced portion of the broadband balun 300.

The minimum length of $L_1$ and/or $L_2$ of the slotline portion 340 is zero (i.e., equal to the width of the broadband balun 300) for embodiments where $$\frac{W}{h} \geq 0.5$$

and h is a thickness of the planar dielectric layer (e.g., 208, 308) between an in-phase trace and an anti-phase trace (e.g., 214*a* and 214*b* as shown in FIG. 2B). This is possible because such embodiments exhibit negligible fringe E-field effects and thus, will not result in unwanted reflections. For embodiments where $$\frac{W}{h} < 0.5,$$

the minimum length of $L_1$ and/or $L_2$ is equal to h (i.e., the slotline portion 340 extends at least h from each of the first side 342 and the second side 344). Such embodiments have non-negligible fringe E-field effects and a length less than h may prevent the fringe E-fields of the desired differential signal from transitioning smoothly. A non-smooth transition will cause unwanted reflections, resulting in increased insertion loss.

The maximum length of $L_1$ and/or $L_2$ of the slotline portion 340, in various embodiments, is less than one quarter of the wavelength of the maximum operating frequency of the electrical system in which the broadband balun 300 is used. In many embodiments, an electrical system including the broadband balun 300 may be designed to resonate at one-quarter wavelengths below the highest operating frequency of the system. Therefore, if $L_1$ and/or $L_2$ exceeds the maximum length, the reflected return path of the slotline may produce quarter-wavelength reflected energy, resulting in resonance.

In some embodiments the slotline may be symmetrical about the propagation direction 301 of the broadband balun 300 (i.e., $L_1 = L_2$) and in other embodiments it may be desirable to provide an asymmetrical slotline portion 340 (i.e., $L_1 \neq L_2$). Further, although the slotline portion 340 is illustrated as a rectangular shape, it will be apparent in view of this disclosure that any suitable shape may be used (e.g., circular, elliptical, or octagonal).

As described in further detail below with reference to the particular embodiments illustrated by FIGS. 13B, 14A, and 14B, the width (W) of the slotline portion 340 varies depending on the particular application and/or electrical system in which the broadband balun 300 is used. Generally, the width of the slotline portion 340 affects the impedance and reflection characteristics of the electrical system, thereby affecting resonance and insertion loss properties.

The slotline open portion 350 may, in various embodiments, include an open taper section 352. In such embodiments, the open taper section 352 extends outward from the slotline portion 340 and broadens at an open angle (θ). For embodiments having a maximum operating frequency of less than 1 GHz, any θ between 0 and 180 degrees is suitable. In such embodiments the use of 0 or 180 degrees in particular may provide for simplicity of design and cost-effective fabrication in comparison to other angles. However, in wider-band applications having a maximum operating frequency greater than 1 GHz, a narrower angular range is required to limit unwanted electromagnetic emissions. Therefore, various such embodiments may incorporate a θ between 60 and 110 degrees for the open taper section to avoid unwanted electromagnetic emissions. If θ is too small, the transition will be too gradual and exhibit distributed reflection characteristics, acting less like an open circuit. If θ is too large, the transition becomes more abrupt and will radiate additional electromagnetic energy, resulting in unwanted reflections.

The slotline open portion 350 may also include an end region 354. The end region 354 may be any suitable shape including, for example, completely open-ended (i.e., the open taper section 352 runs to the edge of the substrate 303 or circuit board on which the ground plane aperture 314 is formed), flat-ended (i.e., the end region 354 is a flat edge of the central ground plane 306 at an end of the open taper section 352 opposite the slotline portion 340), fully circular, or semi-circular. End regions 354 that are completely open-ended or flat-ended are simpler and more cost-efficient to design and fabricate than more complex shapes. However, use of such designs in electrical systems having a maximum operating frequency greater than 1 GHz may cause additional electromagnetic emissions, because these particular electrical trace features create an imbalance in the current flow through the circuit that results in unwanted differential signal reflections. Therefore, various such embodiments may incorporate a fully circular or semi-circular as shown in FIG. 5B) end-region 354 to avoid such unwanted differential signal reflections and, consequently, increased insertion loss.

The minimum radius (R) of circular or semi-circular end regions 354 may, for various embodiments, be one quarter of the wavelength of the maximum operating frequency of the electrical system in which the broadband balun 300 is used. If R is too small, the end region 354 will not behave like an open at lower operating frequencies. Rather, an end region 354 having too small a radius R may cause additional electromagnetic emissions, resulting in unwanted differential signal reflections at transition 300 and, consequently, increased differential signal insertion loss through to 301.

The maximum R of circular or semi-circular end regions 354 may, for various embodiments, be largely dependent on a particular physical design of the ground plane aperture 314. Generally, the maximum R of such end regions 354 will be equivalent to the wavelength of a frequency between the minimum and maximum operating frequency of the electrical system in which the broadband balun 300 is used. In various embodiments, the maximum R will be a wavelength of a frequency in a middle portion of the operating range of the electrical system (e.g., between 25% and 75% of the operating range; between 40% and 60% of the operating range; between 45% and 55% of the operating range). If the value of R was selected to be less than the minimum or greater than the maximum, the system would experience unwanted resonant behavior or high insertion loss performance during operation.

It will be apparent in view of this disclosure that particular dimensions of the slotline 340 and slotline open 350 will be system and/or application specific and that electromagnetic simulations and/or empirical methods may be required for accuracy and to avoid any other resonances, such as cavity resonances.

In various embodiments, additional impedance matching at transition 300 may be achievable by providing a horizontal offset from vertical alignment between an in-phase trace and an anti-phase trace to effectively increase h without actually increasing the vertical dimension h. Such an offset is best illustrated by comparing the offset geometry illustrated by FIG. 6B (ignoring the ground plane 306) to the vertically aligned geometry illustrated by FIG. 6F.

FIG. 6A through FIG. 6F illustrate respective cross sections of the broadband balun 300 shown in FIG. 5A including example electric field distributions at the various sections identified in FIG. 5A. Referring to a first section taken along A-A' illustrated in FIG. 6A, an in-phase terminal 334*a* is located on a top surface of an upper dielectric layer 308*a*. The in-phase terminal 334*a* is in electrical communication with an in-phase trace 304*a* of the unbalanced portion 302 through a first conductive (e.g., plated-through) via 335*a*. Likewise, the anti-phase terminal 334*a* is in electrical communication with an anti-phase trace 304*b* through a second conductive via 335*b*. A ground plane 306 is provided between the two traces 304*a*, 304*b*. An aperture is provided within the ground plane 306 to allow the second via 335*b* to pass through to an opposite side of the ground plane 306, while remaining isolated from the ground plane 306. Also shown are indications of a differential electric field distribution resulting from the presence of a differential signal on the traces 304*a*, 304*b*. The traces 304*a*, 304*b* are vertically misaligned to accommodate intersection with their respective vias 335*a*, 335*b*.

Figure 6A:
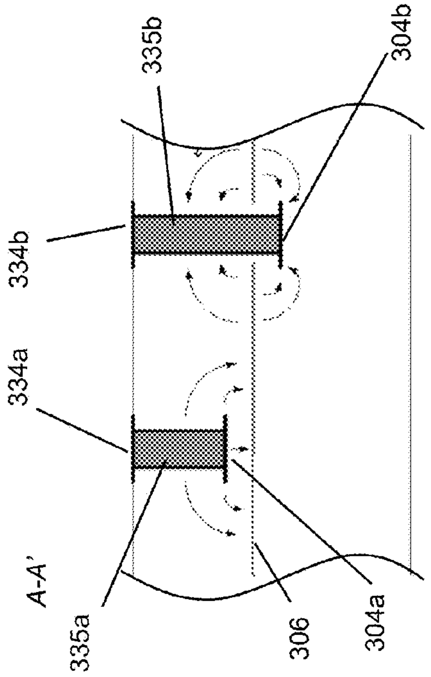
FIG. 6A through FIG. 6F illustrate respective cross sections of the broadband balun shown in FIG. 5 including example electric field distributions at the respective sections.
Figure 6B:
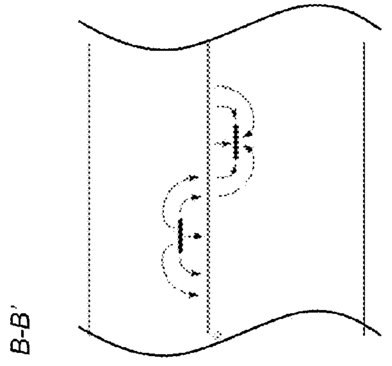
Figure 6C:
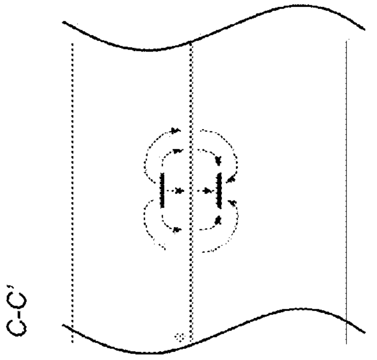

Referring to a second section taken along B-B' illustrated in FIG. 6B, the in-phase trace 304*a* and anti-phase trace 304*b* are approaching, but not yet in vertical alignment. Once again, the respective electric field distributions between each trace 304*a*, 304*b* and the ground plane 306 are shown in schematic form. A third section taken along C-C' illustrated in FIG. 6C showing the in-phase and anti-phase traces 304*a*, 304*b* in vertical alignment. Owing to the structural symmetry and arrangements of the traces 304*a*, 304*b* and the ground plane 306, an upper electric field distribution between the in-phase trace 304*a* and a top surface of the ground plane 306 is substantially aligned with a lower electric field distribution between the anti-phase trace 304*b* and a bottom surface of the ground plane 306.

Figure 6D:
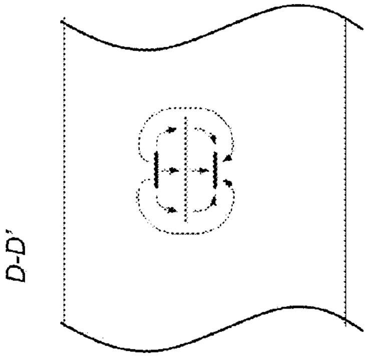
Figure 6E:
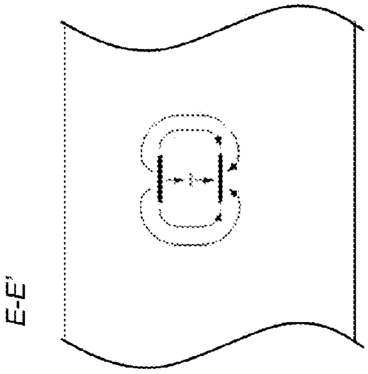
Figure 6F:
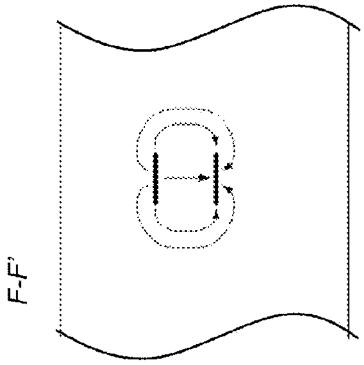

In FIG. 6D a portion of the transition region 320 is shown in a fourth section taken along D-D'. In particular, the ground plane 306 is substantially removed, except for a portion of a ground plane extension. The ground plane extension is in vertical alignment and substantially equidistant between the in-phase and anti-phase traces 304*a*, 304*b*. At least some of the electric field lines terminate at the ground plane 306, while others in the outer regions extend substantially uninterrupted between the traces 304*a*, 304*b* extending around the outer lateral extent of the ground plane extension. In FIG. 6E another portion of the transition region 320 is shown in a fifth section taken along E-E'. In particular, only a very narrow portion of the ground plane 306 remains in vertical alignment between the traces 304*a*, 304*b*. Most of the electric field lines now extend uninterrupted between the traces 304*a*, 304*b*. Finally, in FIG. 6F a sixth section taken along F-F', a cross section of the balanced portion 312 is shown. More particularly, no portion of the ground plane 306 exists, extension or otherwise, within the vicinity of the traces 304*a*, 304*b*.

As a result of symmetries in the arrangement of the traces 304*a*, 304*b* and the ground plane 306 in the unbalanced portion 302, the arrangement or traces 304*a*, 304*b* in the balanced portion 312 and the nature of a differential signal stimulus, the electric field distributions of the unbalanced portion with the ground plane 306 are substantially the same as the electric field distributions of the balanced portion without the ground plane 306.

By removal of the ground plane, the balun 300 is effective in removing common mode currents between the traces 304*a*, 304*b* and the ground plane 306. By removal of the ground plane, the even mode currents effectively vanish (i.e., the even mode impedance approaches infinity), while the odd mode currents prevail. By relying on travelling wave structures (e.g., waveguides), without any resonant elements, the balun 300 performs well over a wide bandwidth. By providing a smooth transition of electric field distributions, the balun 300 avoids unwanted reflections, again supporting wideband operation. By providing impedance matching between the unbalanced and balanced portions, the balun 300 further avoids unwanted reflections supporting wideband operation.

Figures 7A, 7B:
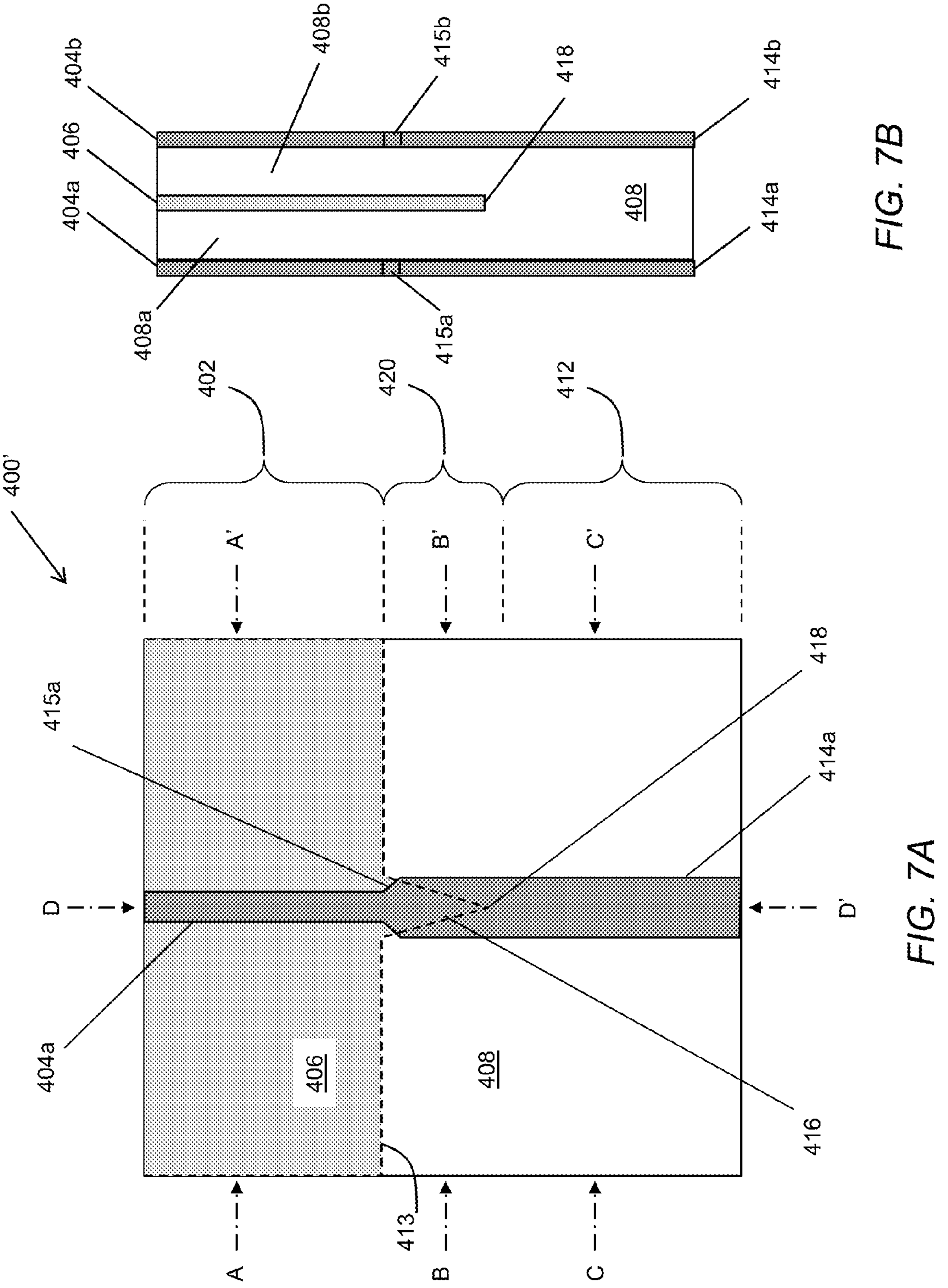
FIGS. 7A and 7B respectively illustrate a planar and a longitudinal cross section of an embodiment of a wideband balun.

FIGS. 7A and 7B respectively illustrate planar and longitudinal cross section taken along D-D' of an embodiment of a wideband balun 400'. Balun 400' shows details of the balun in circuit 300 of FIG. 5 and is shown as Quasi-TEM instead of TEM since the dielectric 408 is shown as bounded by in-phase conductive trace 404*a* and parallel anti-phase conductive trace 404*b* instead of homogeneous dielectric shown in FIG. 6 B through 6F extending substantially above 304*a* and below 304*b*. The balun 400' includes an unbalanced portion 402, a transition region 420 and a balanced portion 412. The unbalanced region 402 includes a vertically aligned pair of opposing microstrip waveguides formed along opposite sides of a central ground plane 406 (again, the ground plane is illustrated as shaded, being visible through a dielectric layer). A first microstrip waveguide includes an in-phase conductive trace 404*a* and a second microstrip waveguide includes a parallel anti-phase conductive trace 404*b*. Each trace 404*a*, 404*b* is separated from a respective side of the conductive ground plane 406 by a dielectric layer 408*a*, 408*b* (generally 408). The balanced region 412 includes a single, parallel-plate waveguide. The parallel-plate waveguide includes an in-phase conductive trace 414*a* and a parallel anti-phase conductive trace 414*b*, separated by a dielectric 408 layer, without the conductive ground plane 406. The transition region 420 includes a bounding edge 413 of the ground plane 406. In the illustrative example, the edge is substantially perpendicular to a longitudinal axis of the balun 400', parallel to and centrally aligned between the pairs of conductive traces 404*a*-404*b*, 414*a*-414*b*.

In at least some embodiments, the transition region 420 also includes an extension 416 projecting away from the bounding edge 413. In the illustrative example, the extension 416 projects toward the balanced portion 412. The extension 416 is generally symmetric about a plane bisecting the traces 404*a*-404*b*, 414*a*-414*b*. The extension 416 can include a taper, for example, being substantially wider at an end adjacent to the bounding edge 413, and narrowing along its projection toward a terminal end 418. In at least some embodiments, the taper can be linear, such as the triangular taper shown. Alternatively or in addition, the extension 416 can include a curved taper or a combination of linear and curved tapers. Preferably, the extension 416 including any taper will assist in transitioning or otherwise shaping a transverse electric field distribution along the axial length of the transition region 420 between respective transverse electric field distributions of the unbalanced portion 402 and the balanced portion 412. The width of trace 404*a* is transitioned to the wider trace of 414*a* at 415. Similarly 404*b* is transitioned to the width of 414*b* at 415. Such a transitioning of the electric fields favorably reduces the possibility of unwanted reflections or mismatch to electromagnetic waves propagating along the balun 400'

In some embodiments, a width of the traces 404*a*, 404*b* of the unbalanced portion 402 is different than a width of the traces 414*a*, 414*b* of the balanced portion 412. For example, the traces of the balanced portion 412 can be wider than the traces of the unbalanced portion. Alternatively or in addition, a separation between the traces can also differ between the unbalanced and balanced regions 402, 412. Selection of such physical parameters as the widths, heights or separation spacing, thicknesses and dielectric constant can be selected to control a physical property of a respective waveguide, such as its characteristic impedance. For example, the physical parameters of the microstrip waveguides of the unbalanced portion 402 can be selected for a characteristic impedance of about 50 Ohms. Similarly, the physical parameters of the parallel-plate waveguide of the balanced portion 420 can be selected for a characteristic impedance of about 100 Ohms. Preferably, characteristic impedances of the unbalanced portion 402 and balanced portion 412 are such that the possibility of any unwanted reflections or mismatch to electromagnetic waves propagating along the balun 400' are minimized.

Unwanted reflections can be characterized according to such parameters as a reflection coefficient (e.g., a ratio of a reflected wave voltage to an incident wave voltage) or as another parameter generally known as a voltage standing wave ratio (VSWR). Another value known as the return loss can be determined as an estimate of inefficiency of energy transfer along the balun, for example, due to unwanted reflections. As a broadband device, the balun 400' exhibits favorable performance (e.g., reflection coefficient, VSWR, return loss) over a relatively wide range of operating frequencies. Such measures of favorable performance may include a VSWR of less than about 2:1, or a return loss of greater than about −9.54 dB. In some embodiments, wideband includes operating frequency range of at least ten times its lower frequency (i.e., 10:1). In at least some embodiments, the balun 400' is capable of operation over at least one of frequency band of operation generally known as millimeter wave transmission and microwave transmission.

Figure 8A:
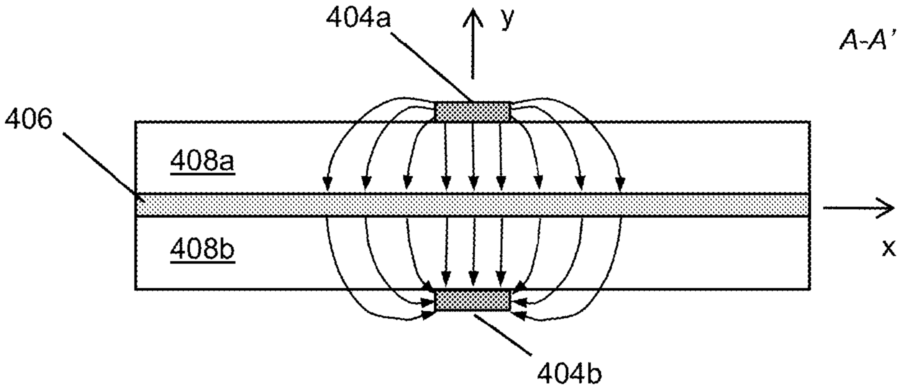
FIG. 8A through FIG. 8C illustrate respective cross sections of the broadband balun shown in FIG. 7A, including example electric field distributions at the various sections identified in FIG. 7A.
Figure 8B:
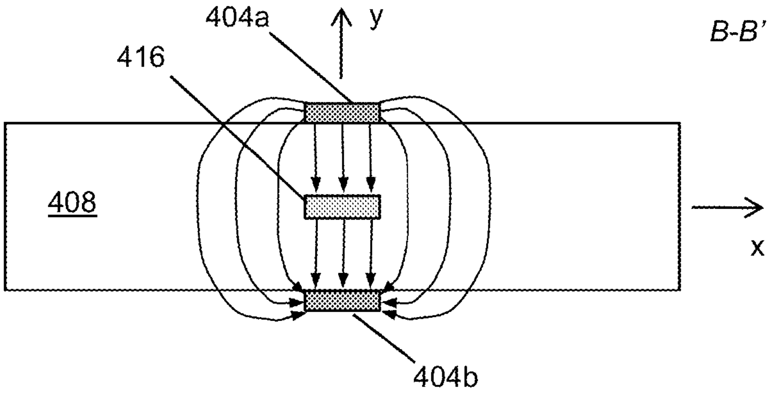
Figure 8C:
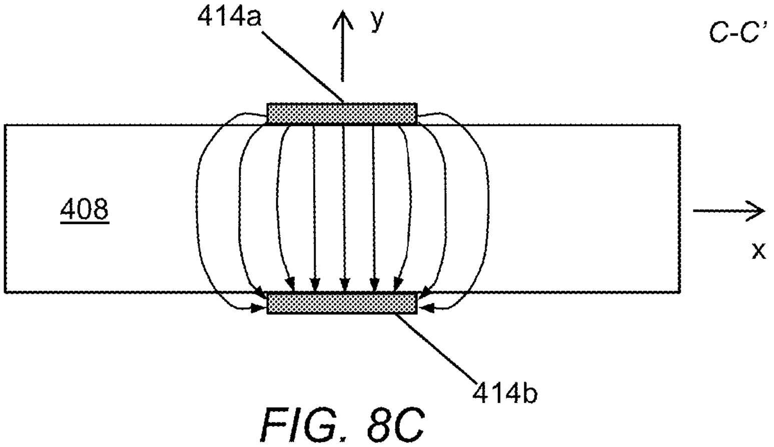

FIG. 8A through FIG. 8C illustrate respective cross sections of the broadband balun 400' shown in FIG. 7A, including example transverse electric fields at the various sections identified in FIG. 7A. A first section taken along A-A' of the unbalanced portion 402 illustrated in FIG. 8A shows transverse electric field distribution with electric fields directed from the in-phase trace 404*a* towards the ground plane 406. The electric field distribution necessarily satisfies electromagnetic boundary conditions of the structure, effectively behaving as if a mirror-image trace having an opposite potential was located along an opposite side of the ground plane. Likewise, the of transverse electric field distribution with electric fields directed from the anti-phase trace 404*b* towards the ground plane 406 also satisfies boundary conditions of the structure, effectively behaving as if a mirror-image trace having an opposite potential was located along an opposite side of the ground plane. As the symmetries attained through satisfaction of boundary conditions correspond to the actual construction of the in-phase and anti-phase traces 404*a*, 404*b*, the transverse electric field distributions of the unbalanced portion are substantially aligned with the ground plane 406, which extends along an equipotential plane. In at least some embodiments, waveguide modes supported in each of the unbalanced and balanced portions 402, 412 are quasi transverse electromagnetic mode (Quasi-TEM). Accordingly, the longitudinal electric field components do exist to a lesser degree than the transverse electromagnetic mode which is more substantial, A second section taken along B-B' of the transition region 420 illustrated in FIG. 8B shows the ground plane extension 418 disposed between the traces 404*a*, 404*b*. Outer fields, those most removed from the y-axis, extend substantially unbroken from the in-phase trace 404*a*, terminating on the anti-phase trace 404*b*. Inner fields from each trace 404*a*, 404*b*, those closer to the y-axis, intersect and therefore terminate along the ground plane extension 418. A third section taken along C-C' of the balanced region 412 illustrated in FIG. 8C shows the parallel-plate waveguide formed by the in-phase trace 414*a* and the anti-phase trace 414*b*. Electric fields extend substantially unbroken from the in-phase trace 414*a*, terminating on the anti-phase trace 414*b*. Electric field distributions of the unbalanced and balanced portions are substantially identical, but for the presence of the ground plane 406.

Figure 9B:
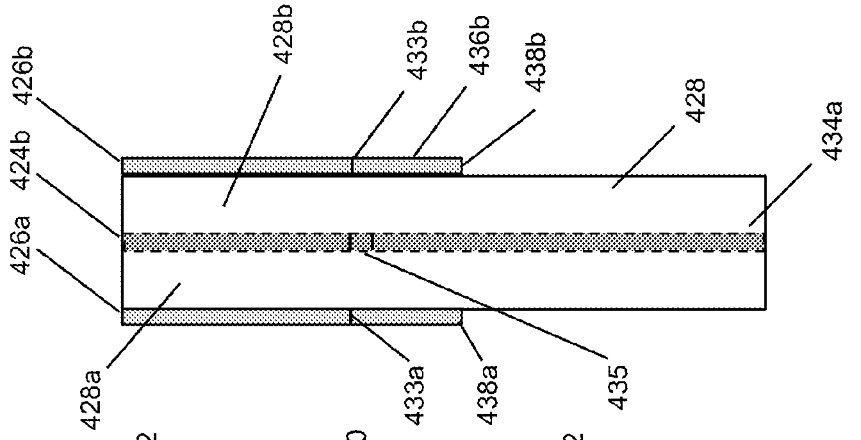
FIGS. 9A and 9B respectively illustrate a planar and a longitudinal cross section of another embodiment of a wideband balun.
Figure 9A:
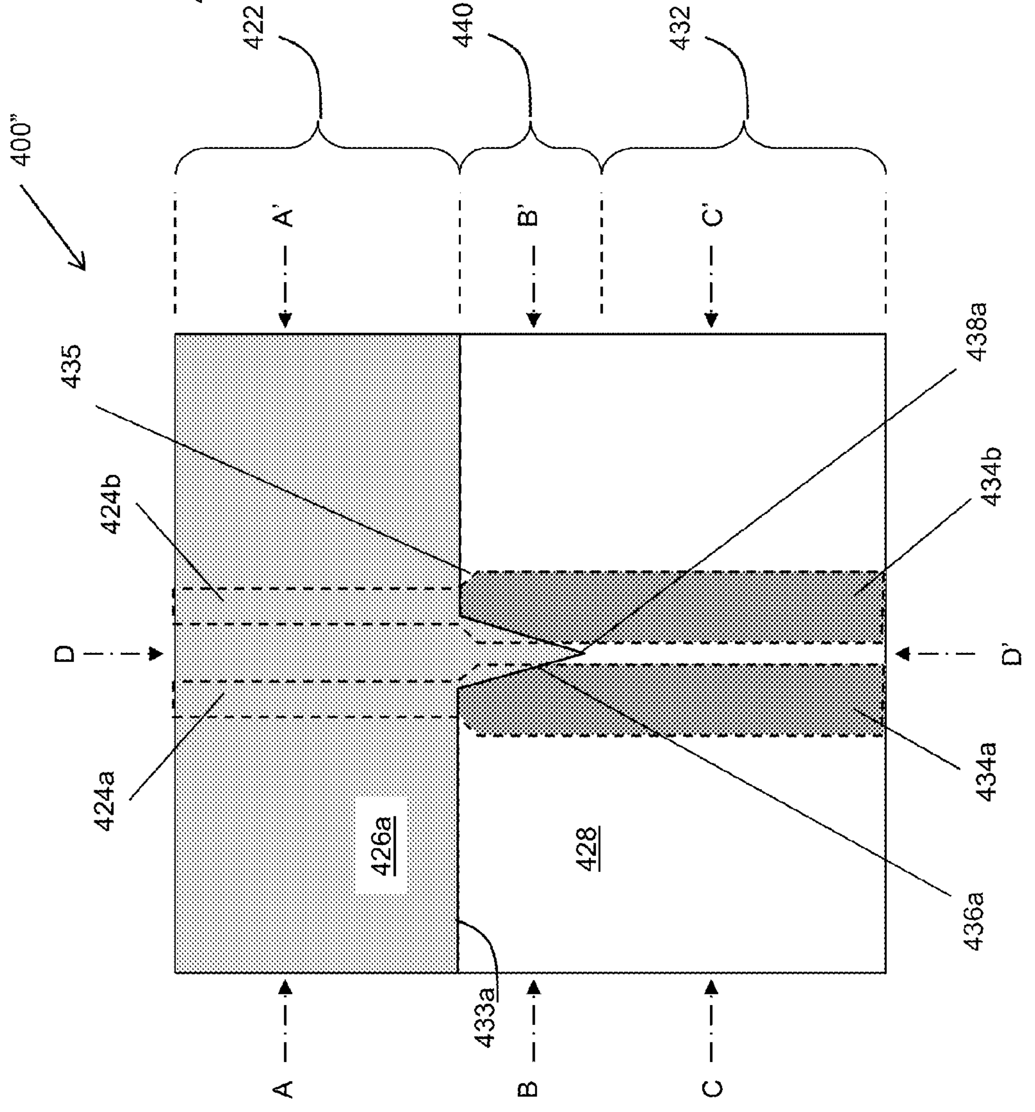

FIGS. 9A and 9B respectively illustrate planar and longitudinal cross section taken along D-D' of another embodiment of a wideband balun 400". The balun 400" includes an unbalanced portion 422, a transition region 440 and a balanced portion 432. The unbalanced region 422 includes a coplanar stripline waveguide formed between upper and lower parallel ground planes 426*a*, 426*b*. The waveguide includes an in-phase conductive trace 424*a* and a co-planar, parallel anti-phase conductive trace 424*b*. Each trace 424*a*, 424*b* is separated from upper and lower adjacent ground planes 426*a*, 426*b* by an interposed dielectric layer 428*a*, 428*b* (generally 428). The balanced region 432 includes a co-planar waveguide embedded within the dielectric layer 428. The co-planar waveguide includes an in-phase conductive trace 434*a* and a parallel anti-phase conductive trace 434*b*. The transition region 440 includes an upper bounding edge 433*a* of the upper ground plane 426*a* and a lower bounding edge 433*b* of the lower ground plane 426*b*. In the illustrative example, the edges 433*a*, 433*b* are substantially perpendicular to a longitudinal axis of the balun 400", parallel to and centrally aligned between the pairs of conductive traces 424*a*, 424*b*, 434*a*, 434*b*. In the illustrative example, the edges 433*a*, 433*b* are substantially aligned or otherwise overlapping in a common transverse plane.

In at least some embodiments, the transition region 440 also includes an upper extension 436*a* projecting away from the upper bounding edge 433*a* and a lower extension 436*b* projecting away from the lower bounding edge 433*b*. In the illustrative example, the extensions 436*a*, 436*b* project toward the balanced portion 432. The extensions 436*a*, 436*b* are generally symmetric about a plane bisecting the traces 424*a*, 424*b*, 434*a*, 434*b* and including the longitudinal axis. Once again, the extensions 436*a*, 436*b* can include a taper, for example, being substantially wider at an end adjacent to the bounding edge 433*a*, 433*b*, narrowing along its projection to a terminal end 438*a*, 438*b*. In at least some embodiments, the taper can be linear, such as the triangular taper shown. Alternatively or in addition, the extensions 436*a*, 436*b* can include a curved taper or a combination of linear and curved tapers. Preferably, the extensions 436*a*, 436*b* including any taper will assist in transitioning or otherwise shaping an electric field along the transition region 440 between respective transverse electric field distributions of the unbalanced portion 422 and the balanced portion 432.

In some embodiments, a width of the traces 424*a*, 424*b* of the unbalanced portion 422 is different than a width of the traces 434*a*, 434*b* of the balanced portion 432. For example, the traces of the balanced portion 432 can be wider than the traces of the unbalanced portion 422. Transition between different widths can include a stepped discontinuity, a chamfer 435 as shown, or any other suitable profile. In some embodiments, the transition can be accomplished in multiple such steps.

Alternatively or in addition, a separation between the traces can also differ between the unbalanced and balanced regions 422, 432. Selection of such physical parameters as the widths, heights or separation spacing, thicknesses and dielectric constant can be selected to control a physical property of a respective waveguide, such as its characteristic impedance. For example, the physical parameters of the microstrip waveguides of the unbalanced portion 422 can be selected for a characteristic impedance of about 50 Ohms. Similarly, the physical parameters of the co-planar waveguide of the balanced portion 432 can be selected for a characteristic impedance of typically about 50 Ohms to 200 Ohms. Preferably, characteristic impedances of the unbalanced portion 422 and balanced portion 432 are chosen such that the possibility of unwanted reflections or mismatch to electromagnetic waves propagating along the balun 400" are minimized.

Figure 10A:
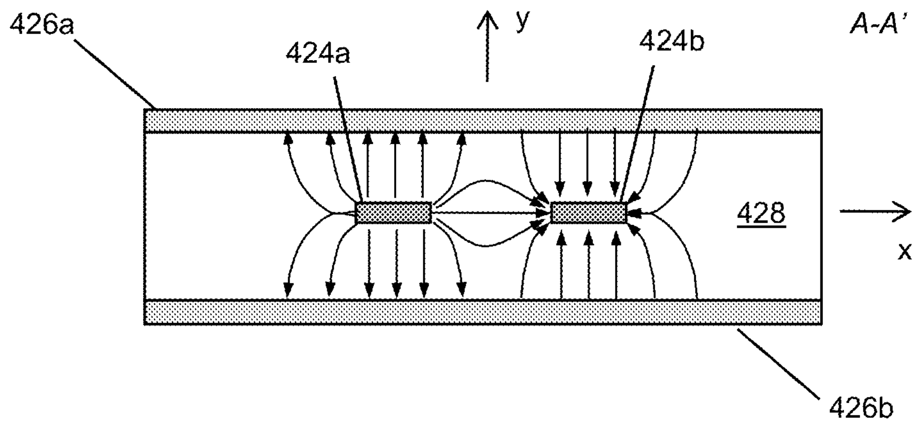
FIG. 10A through FIG. 10C illustrate respective cross sections of the broadband balun shown in FIG. 9A, including example electric field distributions at the various sections identified in FIG. 9A.
Figure 10B:
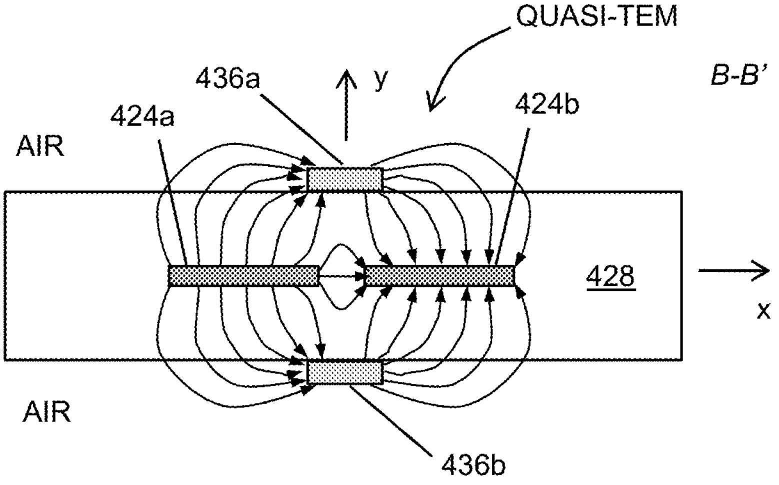
Figure 10C:
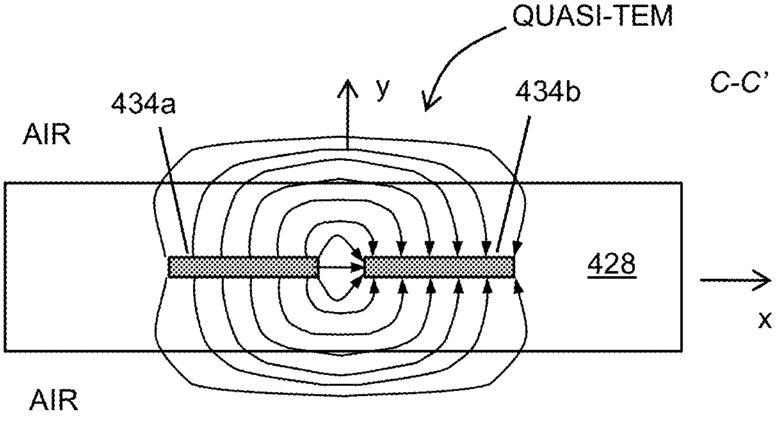

FIG. 10A through FIG. 10C illustrate respective cross sections of the broadband balun shown in FIG. 9A, including example transverse electric fields at the various sections identified in FIG. 9A. A first section taken along A-A' of the unbalanced portion 422 is illustrated in FIG. 10A, showing transverse electric field distribution with electric fields directed from each of the in-phase and anti-phase traces 424*a*, 424*b* towards the opposing trace and towards the ground planes 426*a*, 426*b*. The electric field distribution may partially extend above and below the dielectric 428 (not as shown) for Quasi-TEM (as shown in FIG. 10B), effectively behaving as if a first symmetric image coplanar waveguide having an opposite potential was located along an opposite side of the upper ground plane 426*a* and a second symmetric image coplanar waveguide having an opposite potential was located along an opposite side of the lower ground plane 426*b*.

A second section taken along B-B' of the transition region 440 is illustrated in FIG. 10B, showing the upper and lower ground plane extensions 436*a*, 436*b* disposed respectively above and below the traces 424*a*, 424*b*. A narrowing of the ground planes along the extensions 436*a*, 436*b* alters the fields according to electromagnetic boundary conditions of the reduced extent ground. The net effect in the illustrative example is to effectively bend the outer electric fields of each of the traces 424*a*, 424*b* toward the opposite trace (i.e., toward the y-axis). A third section taken along C-C' of the balanced region 432 is illustrated in FIG. 10C, showing the co-planar waveguide formed by the in-phase trace 434*a* and the anti-phase trace 434*b*. Electric fields extend substantially unbroken from the in-phase trace 434*a*, terminating on the anti-phase trace 434*b*. The series of cross sections illustrates how the tapered extension smoothly transitions transverse electric fields from the unbalanced portion 422 to the balanced portion 432 over a distance along the longitudinal axis.

Figures 11A, 11B:
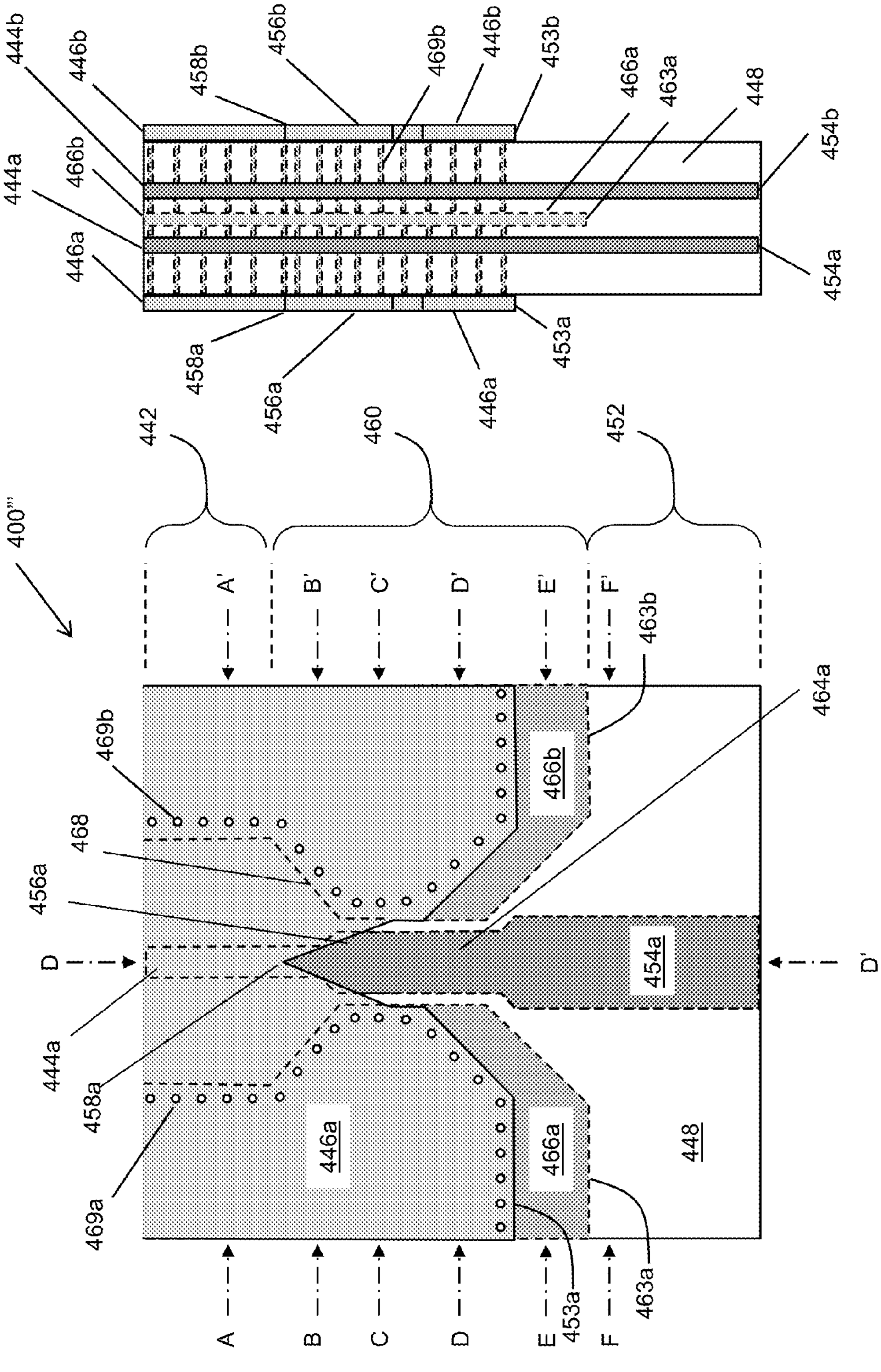
FIGS. 11A and 11B respectively illustrate a planar and a longitudinal cross section of yet another embodiment of a wideband balun.

FIGS. 11A and 11B respectively illustrate planar and longitudinal cross section taken along D-D' of another embodiment of a wideband balun 400'''. The balun 400''' includes an unbalanced portion 442, a transition region 460 and a balanced portion 452. The unbalanced region 442 includes a parallel-plate stripline waveguide formed between upper and lower parallel ground planes 446*a*, 446*b*. The waveguide includes an in-phase conductive trace 444*a* and a vertically aligned parallel anti-phase conductive trace 444*b*. Each trace 444*a*, 444*b* is separated from each other and from adjacent ground planes 446*a*, 446*b* by a dielectric layer 448. The balanced region 452 includes a parallel-plate waveguide embedded within the dielectric layer 448. The parallel-plate waveguide includes an in-phase conductive trace 454*a* and a parallel anti-phase conductive trace 454*b*. The transition region 460 includes an upper bounding edge 453*a* of the upper ground plane 446*a* and a lower bounding edge 453*b* of the lower ground plane 446*b*. In the illustrative example, the edges 453*a*, 453*b* are substantially perpendicular to a longitudinal axis of the traces 444*a*, 444*b*, 454*a*, 454*b*. In the illustrative example, the edges 453*a*, 453*b* are substantially aligned or otherwise overlapping in a common transverse plane.

In at least some embodiments, the transition region 460 also includes an upper extension 456*a* projecting away from the upper bounding edge 453*a* and a lower extension 456*b* projecting away from the lower bounding edge 453*b*. In the illustrative example, the extensions 456*a*, 456*b* project toward the unbalanced portion 442. The extensions 436*a*, 436*b* are generally symmetric about a plane bisecting the traces 444*a*, 444*b*, 454*a*, 454*b* and including the longitudinal axis. Once again, the extensions 456*a*, 456*b* can include a taper, for example, being substantially wider at an end adjacent to the bounding edge 453*a*, 453*b*, narrowing along its projection to a terminal end 458*a*, 458*b*. In the illustrative embodiment, the extension is provided as a notch in the ground plane 466*a*, 466*b*. In at least some embodiments, the taper can be linear, such as the triangular taper shown. Alternatively or in addition, the extensions 456*a*, 456*b* can include a curved taper or a combination of linear and curved tapers. Preferably, the extensions 456*a*, 456*b* including any taper will assist in transitioning or otherwise shaping transverse electric fields along the transition region 460 between respective transverse electric field distributions of the unbalanced portion 442 and the balanced portion 452.

The wideband balun 400''' further includes a split intermediate analog ground plane including a left-hand portion 466*a* and a right-hand portion 466*b*. In the example embodiment, each of the left and right-hand portions 466*a*, 466*b* of the intermediate analog ground plane resides in the same plane substantially equidistant between the upper and lower ground planes 446*a*, 446*b* and along either side of a plane bisecting the traces 444*a*, 444*b*, 464*a*, 464*b* and including the longitudinal axis. The left-hand intermediate ground plane 466*a* includes a respective bounding edge 463*a*. Similarly, the right-hand intermediate ground plane 466*b* includes a respective bounding edge 463*b*. In the illustrative example, the edges 463*a*, 463*b* are substantially aligned along a common axial location and perpendicular to a longitudinal axis of the traces 444*a*, 444*b*, 454*a*, 454*b*. In the illustrative example, the edges 463*a*, 463*b* extend beyond the bounding edge 453*a*, 453*b* of the upper and lower ground planes 446*a*, 446*b*, closer to the balanced portion 452. It is envisioned that in some embodiments that the edges 463*a*, 463*b*, 453*a*, 453*b* can be arranged in overlapping arrangement at a common axial location, or that the upper and lower edges 453*a*, 453*b* can extend further towards the balanced portion 452 than the intermediate edges 463*a*, 463*b*. It is also envisioned that in some embodiments that the vias 469*a* and 469*b* extend further towards the balanced portion 452 than the intermediate edges 463*a*, 463*b*.

In at least some embodiments, the left and right-hand portions 466*a*, 466*b* of the intermediate ground plane are spaced sufficiently apart from the in-phase and anti-phase traces 444*a*, 444*b* of the unbalanced portion 442 such that coupling of transverse electric fields to the intermediate ground plane is substantially negligible within the unbalanced region 442. In a transition region, the left and right-hand portions 466*a*, 466*b* of the intermediate ground plane are spaced relatively close to the in-phase and anti-phase traces 464*a*, 464*b* of the intermediate region 460 resulting in coupling of at least a portion of the transverse electric fields to the intermediate ground plane.

The balun 400''' further includes left and right-hand vertical analog ground screens 469*a*, 469*b*. Such vertical ground screens 469*a*, 469*b* can be provided, for example, by vertically aligned conductive elements. In the illustrative embodiment, the vertical conductive elements are provided by conducting (i.e., plated-through) vias extending between and electrically interconnecting the upper and lower ground planes 446*a*, 446*b*. In at least some embodiments, the conductive vias are disposed adjacent to edges of the left and right-hand portions 466*a*, 466*b* facing the central axis. Spacing between adjacent vias of such a "picket fence" arrangement can be controlled, for example, having a maximum separation between adjacent vias of less than one-quarter minimum-operating wavelength. Preferably, separation between adjacent vias is no more than about one-tenth of a minimum-operating wavelength.

In some embodiments, a width of the traces 444*a*, 444*b* of the unbalanced portion 442 is the same as a width of the traces 454*a*, 454*b* of the balanced portion 452. In other embodiments the widths are different, as illustrated. For example, the traces of the balanced portion 452 can be narrower or wider (as shown) than the traces of the unbalanced portion 442. Alternatively or in addition, a separation between the traces 444*a*-444*b*, 454*a*-454*b* can also differ or be the same (as shown) between the unbalanced and balanced regions 442, 452. Selection of such physical parameters as the widths, heights or separation spacing, thicknesses and dielectric constant can be selected to control a physical property of a respective waveguide, such as its characteristic impedance. For example, the physical parameters of the parallel-plate stripline waveguide of the unbalanced portion 442 can be selected for a characteristic impedance of typically about 50 Ohms to 100 Ohms. Similarly, the physical parameters of the embedded parallel-plate waveguide of the balanced portion 452 can be selected for a preferred characteristic impedance, for example, of about 50 Ohms to 100 Ohms. Preferably, characteristic impedances of the unbalanced portion 442 and balanced portion 452 are chosen such that the possibility of unwanted reflections or mismatch to electromagnetic waves propagating along the balun 400''' are minimized.

In some of the embodiments described herein, transitions between traces having different widths can be accomplished in a stepped or graded fashion (e.g., a rectangular transition from one width to the next). Alternatively or in addition, transitions between different widths can be accomplished in a less abrupt manner, for example having a taper or chamfer as provided in the examples described herein. The taper can be linear, curved, or any suitable combination of linear and curved. Additionally, for embodiments in which the difference in widths is relatively substantial, the transition can be accomplished in multiple transitions occurring over a series of steps. For example, in the illustrative embodiment, intermediate traces 464*a*, 464*b* are provided in the transition region 460, having a width between the widths of the unbalanced portion traces 444*a*, 444*b* and the balanced portion traces 454*a*, 454*b*.

Figure 12A:
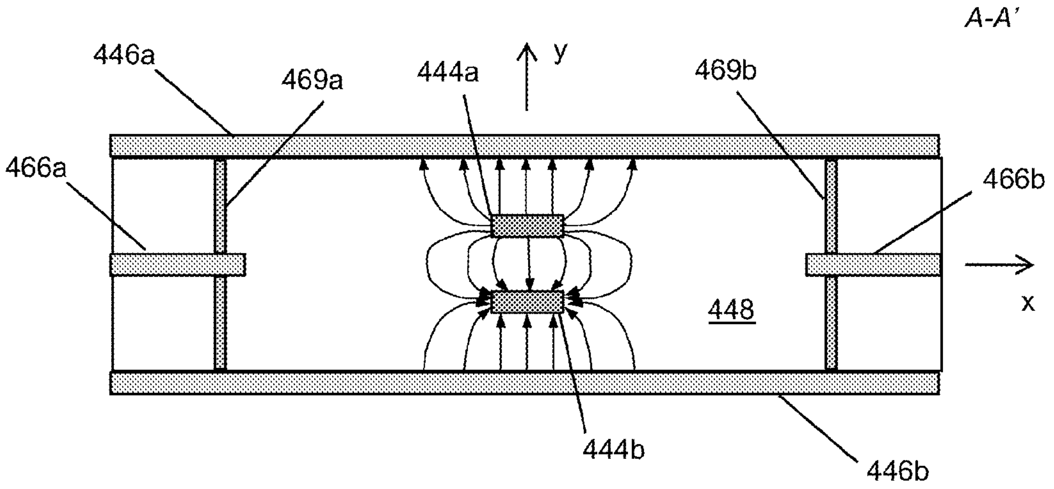
FIG. 12A through FIG. 12F illustrate respective cross sections of the broadband balun shown in FIG. 11A, including example electric field distributions at the various sections identified in FIG. 11A.

FIG. 12A through FIG. 12F illustrate respective cross sections of the broadband balun shown in FIG. 11A, including example transverse electric fields at the various sections identified in FIG. 11A. A first section taken along A-A' of the unbalanced portion 422 illustrated in FIG. 12A shows transverse electric field distribution including electric fields directed from the in-phase and anti-phase traces 444*a*, 444*b* towards the opposing trace and towards the upper and lower ground planes 466*a*, 466*b*. The electric field distribution satisfies boundary conditions of the structure, effectively behaving as if a first symmetric image parallel-plate waveguide having an opposite potential was located along an opposite side of the upper ground plane 466*a* and a second symmetric image parallel-plate waveguide having an opposite potential was located along an opposite side of the lower ground plane 466*b* (i.e., mirror images).

Figure 12B:
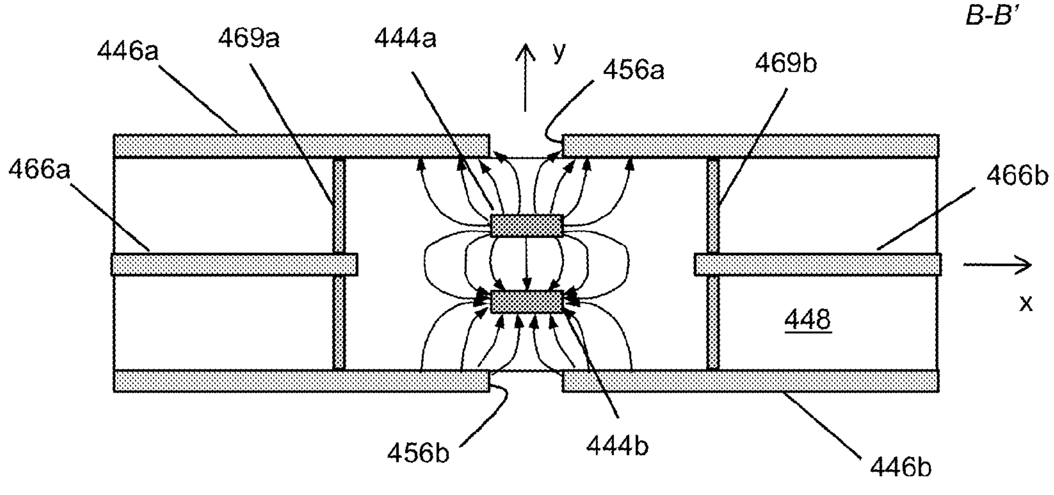

A second section taken along B-B' of the transition region 460 illustrated in FIG. 12B shows the upper and lower ground plane extensions 446*a*, 446*b* disposed respectively above and below the traces 444*a*, 444*b*. A central opening in each of the ground planes 446*a*, 446*b* along the extensions 456*a*, 456*b* alters the fields according to electromagnetic boundary conditions of the altered ground. The net result in the illustrative example is to effectively bend the upper and lower electric fields nearest the y-axis of each of the traces 444*a*, 444*b* outward (i.e., away from the y-axis). This arrangement begins reshaping of the fields between the traces and their adjacent ground plane extension 446*a*, 446*b* from vertical (i.e., y-axis directed) toward horizontal (i.e., x-axis directed).

Figure 12C:
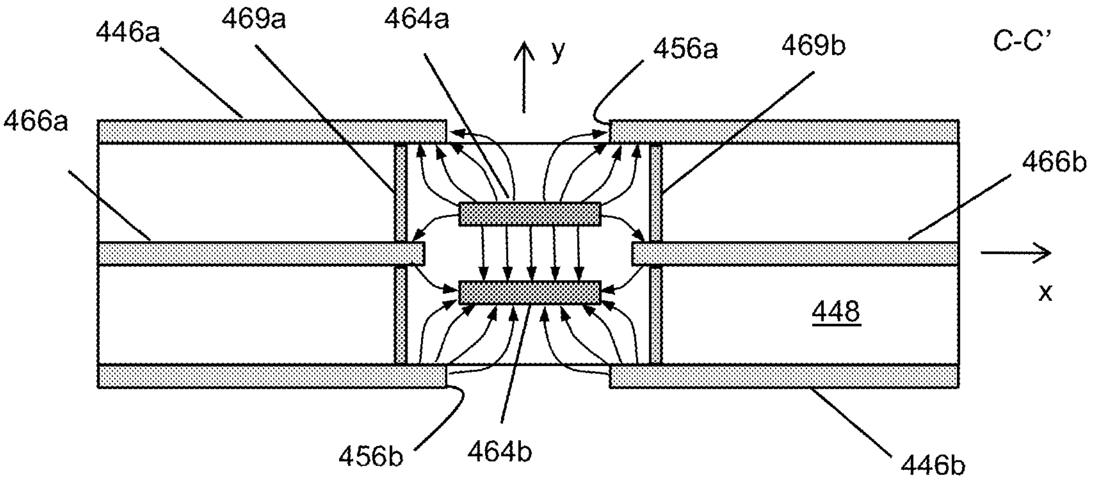

A third section taken along C-C' of the balanced region 452 illustrated in FIG. 12C shows an increased central opening in each of the ground planes 446*a*, 446*b* along the extensions 456*a*, 456*b* further altering or otherwise shaping the transverse electric fields according to electromagnetic boundary conditions of the altered grounds 446*a*, 446*b*. The net effect in the illustrative example is to effectively bend the upper and lower electric fields further away from the y-axis. Additionally, the left and right-hand portions 466*a*, 466*b* of the intermediate ground plane and the corresponding vertical ground screens 469 are arranged relatively close to the in-phase and anti-phase traces 464*a*, 464*b* of the transition region 460. The proximity is such that at least a portion of the transverse electric field distribution satisfies boundary conditions of the structure, effectively behaving as if a first symmetric image parallel-plate waveguide having an opposite potential was located along an opposite side of the left and right vertical ground screens 469*a*, 469*b*. The result is to reshape those fields further away from the plane bisecting the traces and including the longitudinal axis from vertical (i.e., y-axis directed) toward horizontal (i.e., x-axis directed).

Figure 12D:
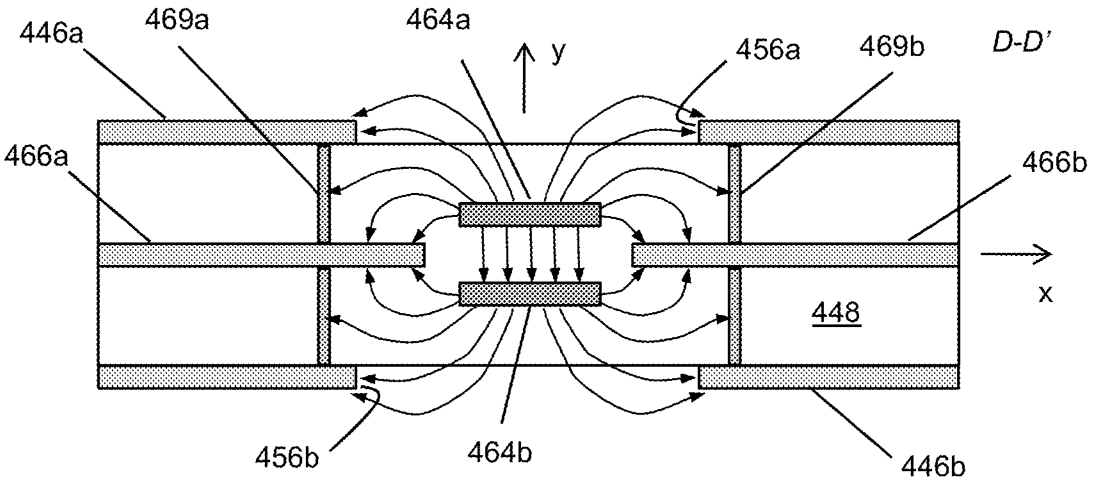

A fourth section taken along D-D' of the balanced region 452 illustrated in FIG. 12D shows an even further increased central opening in each of the ground planes 446*a*, 446*b* along widening extensions further altering or otherwise shaping the transverse electric fields according to electromagnetic boundary conditions of the altered grounds 446*a*, 446*b*. The left and right-hand portions 466*a*, 466*b* of the intermediate ground plane remain relatively close to the in-phase and anti-phase traces 464*a*, 464*b* of the transition region 460, whereas the corresponding vertical ground screens 469*a*, 469*b* have been moved farther away from the traces 464*a*, 464*b*. The proximity is such that at least a portion of the transverse electric field distribution satisfies boundary conditions of the structure, effectively behaving as if a first symmetric image parallel-plate waveguide having an opposite potential was located along an opposite side of the left and right vertical ground screens 469*a*, 469*b*. The result is to further reshape those fields further away from the plane bisecting the traces and including the longitudinal axis from vertical (i.e., y-axis directed) toward horizontal (i.e., x-axis directed).

Figure 12E:
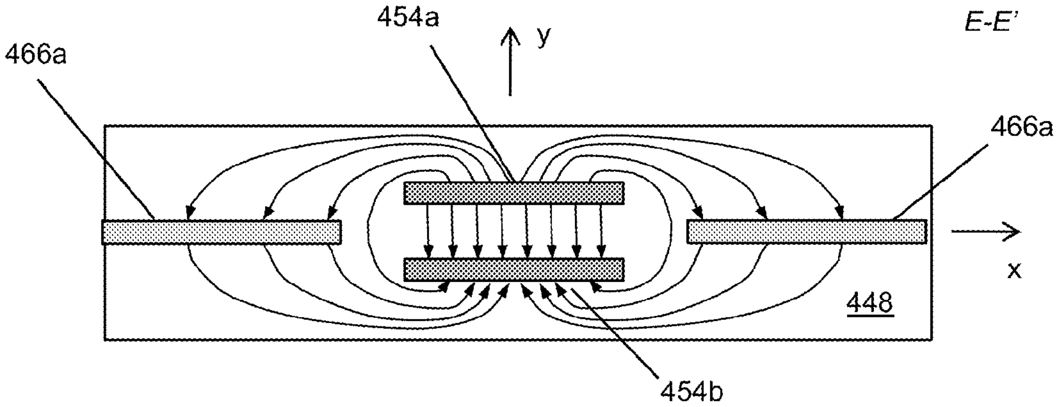

A fifth section taken along E-E' of the balanced region 452 illustrated in FIG. 12E shows the embedded parallel-plate waveguide after removal of the upper and lower ground planes 446*a*, 446*b* (e.g., axially located between the bounding edge 453 and the balanced portion 452). Once again, the transverse electric fields adjust according to electromagnetic boundary conditions of the altered ground having left and right-hand portions 466*a*, 466*b* of the intermediate ground plane disposed along an equipotential plane. The transverse electric fields have been coerced or otherwise tailored from an unbalanced region distribution of the parallel-plate stripline waveguide to a balanced region distribution of the embedded parallel-plate waveguide by imposing boundary conditions of one or more of the upper and lower ground planes 446*a*, 446*b*, the left and right-hand portions 466*a*, 466*b* of the intermediate ground plane and the left and right-hand vertical ground screens 469*a*, 469*b*.

Figure 12F:
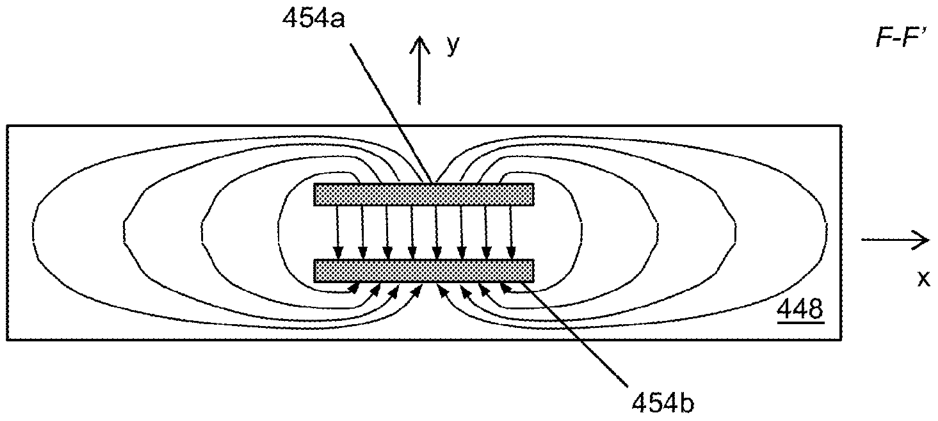

A sixth section taken along F-F' of the balanced region 452 illustrated in FIG. 12F shows the embedded parallel-plate waveguide formed by the in-phase trace 454*a* and the anti-phase trace 454*b*. Electric fields extend substantially unbroken from the in-phase trace 454*a*, terminating on the anti-phase trace 454*b*. The series of cross sections illustrates how the tapered extension smoothly transitions transverse electric fields from the unbalanced portion 442 to the balanced portion 452.

Figure 13A:
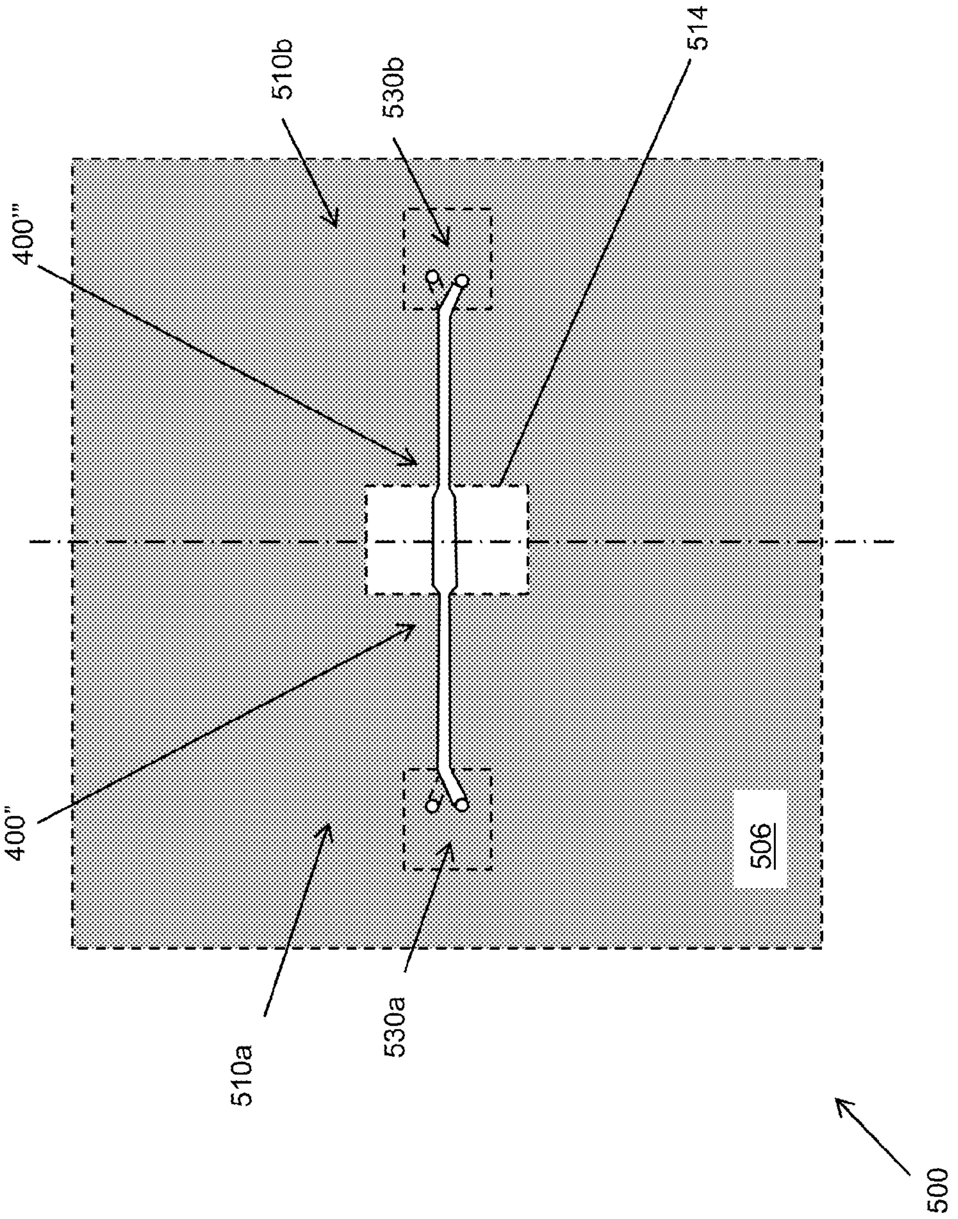
FIG. 13A and FIG. 13B illustrate planar views of various embodiments of two wideband baluns interconnected in a back-to-back configuration, otherwise referred to as a wideband balun choke.

FIG. 13A illustrates a planar view of an embodiment of a balun circuit including two wideband baluns 510*a*, 510*b* interconnected in a back-to-back configuration, otherwise referred to as a wideband balun choke 500. In more detail, a first balun 510*a* includes a differential signal port 530*a* disposed at an unbalanced end of the balun 510*a*. Similarly, a second balun 510*b* includes a differential signal port 530*b* disposed at an unbalanced end of the balun 510*b*. An analog ground 506 includes an aperture 514 in the vicinity of the balanced portions of the adjoined baluns 510*a*, 510*b*. Each of the baluns 510*a*, 510*b* is arranged along a common longitudinal axis and in facing arrangement of their respective balanced ends. The balanced ends are coupled or otherwise adjoined allowing for signal propagation from one differential signal port 530*a*, 530*b* to the other 530*b*, 530*a*. The baluns 510*a*, 510*b* can be any suitable broadband balun, such as those described herein. In at least some embodiments, the baluns 510*a*, 510*b* share a common configuration.

Figure 13B:
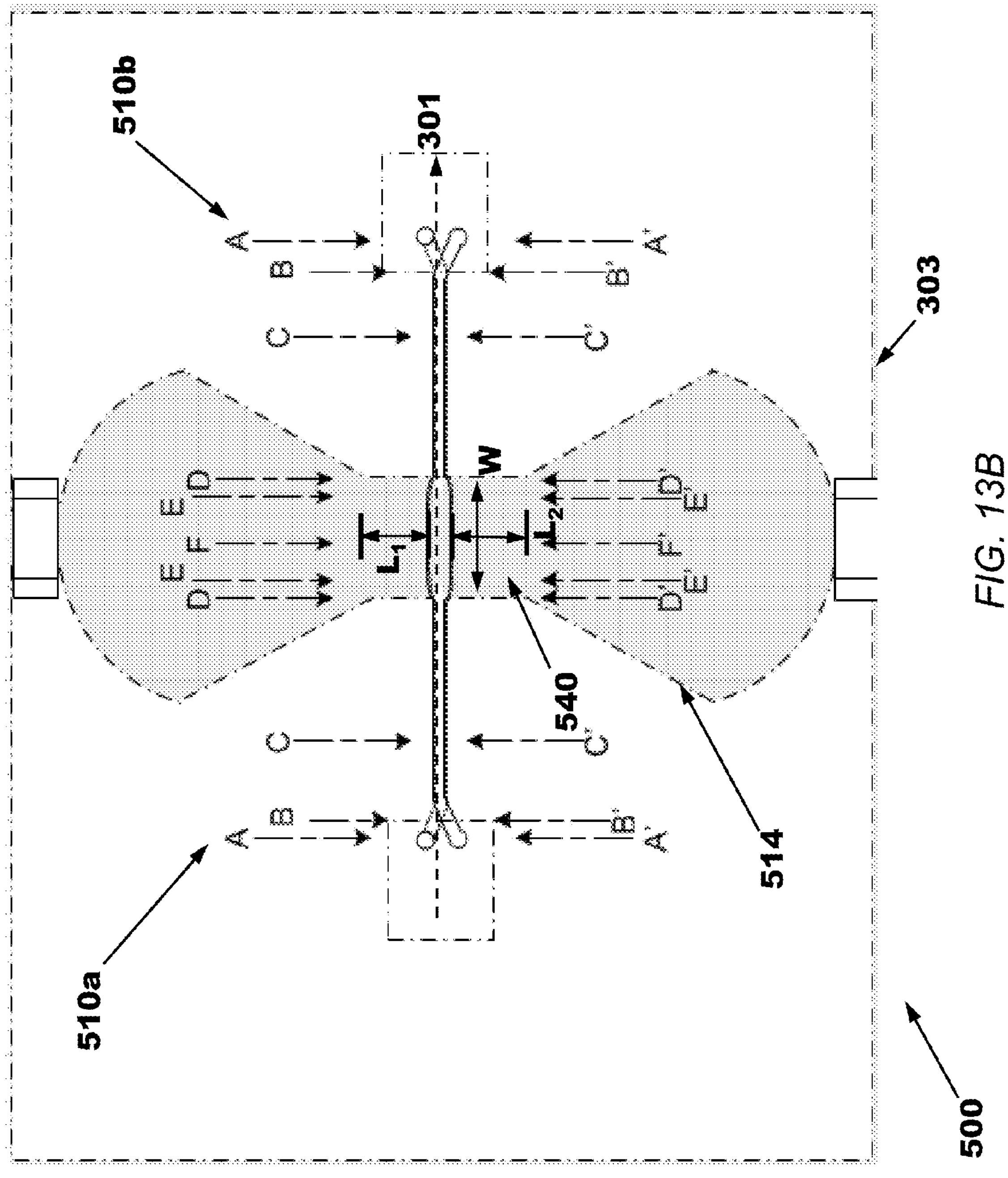

As shown in FIG. 13B, the aperture 514 of the analog ground 506 may be any variety of shapes and/or sizes as described above with reference to the aperture 314 and analog ground 303 of FIG. 5B. The two wideband baluns 510*a*, 510*b* of a wideband balun choke 500 as illustrated in FIGS. 13A and 13B may each be, for example, a wideband balun 300 as described with reference to FIGS. 5A and 5B.

The width (W) of the slotline portion 340, 540, in various example back-to-back configurations (e.g., the wideband balun choke 500 illustrated in FIGS. 13A and 13B) may be a maximum of less than one quarter of the maximum operating frequency of the electrical system in which the wideband baluns 510*a*, 510*b* are used. When W reaches or exceeds this maximum value, round-trip reflections in the system may resonate with the input signal. The minimum W of the slotline portion 540 may, for example, be sufficiently wide to produce a slotline impedance $Z_{OS}$ equal to double the total impedance of the balanced portion of the balun $Z_{OB}$ as described above with reference to FIGS. 2A and 2B. The total impedance of the slotline $Z_{OS}$ can be related to W according to any number of known methods, including for example, at least one of the Transverse Resonance Method, Galerkin's Method, or Cohn's Numerical Method. When W is less than the minimum value, the impedance of the slotline may approach the total impedance of the second in-phase and anti-phase traces, resulting in additional signal energy coupling into the ground plane aperture 314, 514, thereby increasing insertion loss.

Figure 14A:
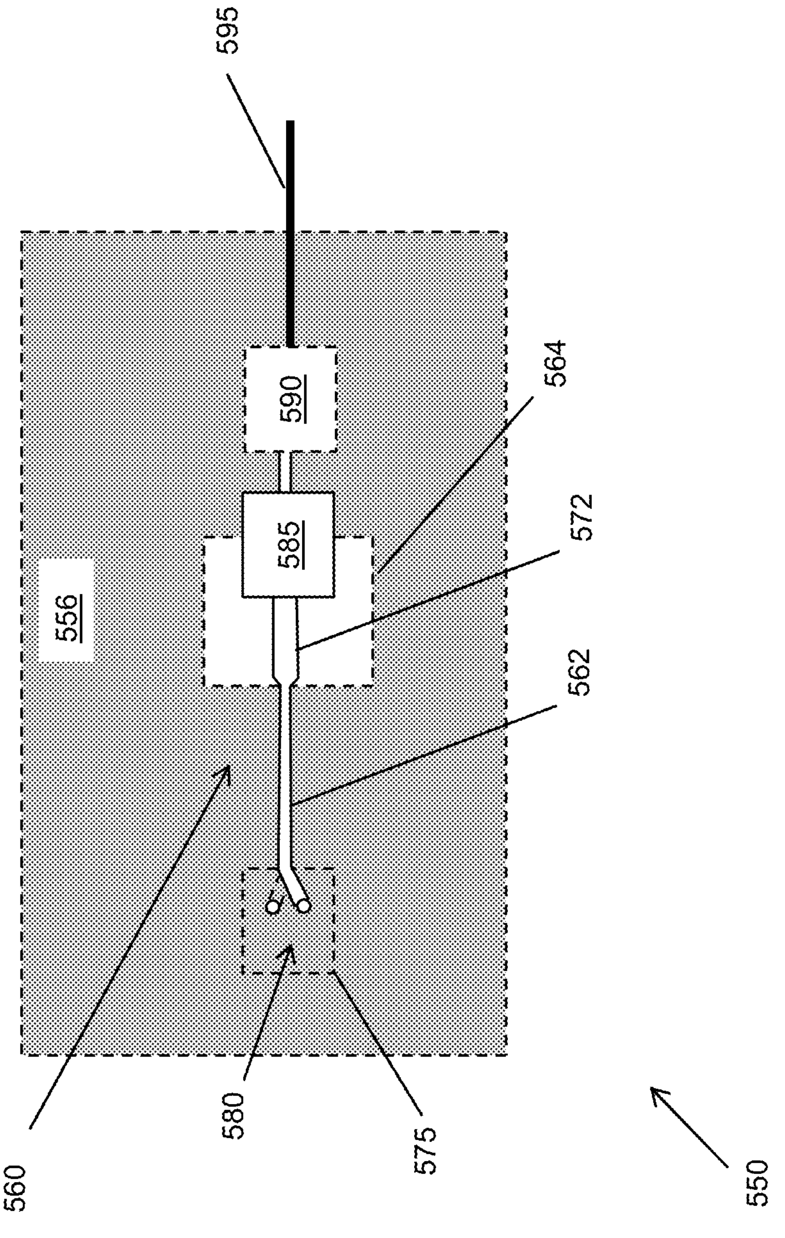
FIG. 14A and FIG. 14B illustrate planar views of various embodiments of a wideband balun circuit including a differential filter.

FIG. 14A illustrates a planar view of an embodiment of another balun circuit 550 including a wideband balun 560 combined with a differential filter 585. In particular, a wideband balun 560 includes a differential signal port 580 disposed at one end of an unbalanced portion 562 of the balun 560. Also shown is a footprint 575 of a differential circuit element for interconnection to the differential signal port 580. The differential circuit may be a differential signal source (e.g., driver) or sink (e.g., receiver). The balun 560 includes a balanced portion 572 and a transition region according to the techniques described herein. An analog ground 556 includes an aperture 564 in the vicinity of the balanced portion 572 and at least a balanced end of the filter 585. A differential signal is provided at one end of the balun 560, for example, at the unbalanced portion 562 and propagates toward the opposite end (e.g., the balanced portion 572).

The differential filter 585 can be any suitable filter, for example including one or more of inductive, capacitive and resistive elements. In at least some embodiments, the filter includes a high degree of symmetry with respect to the in-phase and anti-phase traces of the balanced portion 572. Such construction may contain a shared capacitive element, for example, interconnected symmetrically between the two traces of the balanced portion 572. The filter can be designed according to well known filter design and/or synthesis methods and can have any desirable attenuation profile, such as low-pass, high-pass and band-pass. In at least some embodiments, the filter includes two series capacitive elements, each in electrical communication with a respective trace of the balanced portion 572 and providing a block to direct current (DC) signals. In at least some embodiments, the filter is unshielded further preserving the balanced features of the balanced portion 572.

In some embodiments a filtered output, still balanced, can be transitioned between another unbalanced portion 595 configured to accommodate single-ended signals, rather than differential signals. Such a transition can be accomplished with a balun 590. The balun 590 can be provided by any of the balun techniques described herein, or more generally, from any suitable prior art balun. For situations in which the filter restricts bandwidth of the balanced signal, the balun can be a relatively narrowband balun.

Figure 14B:
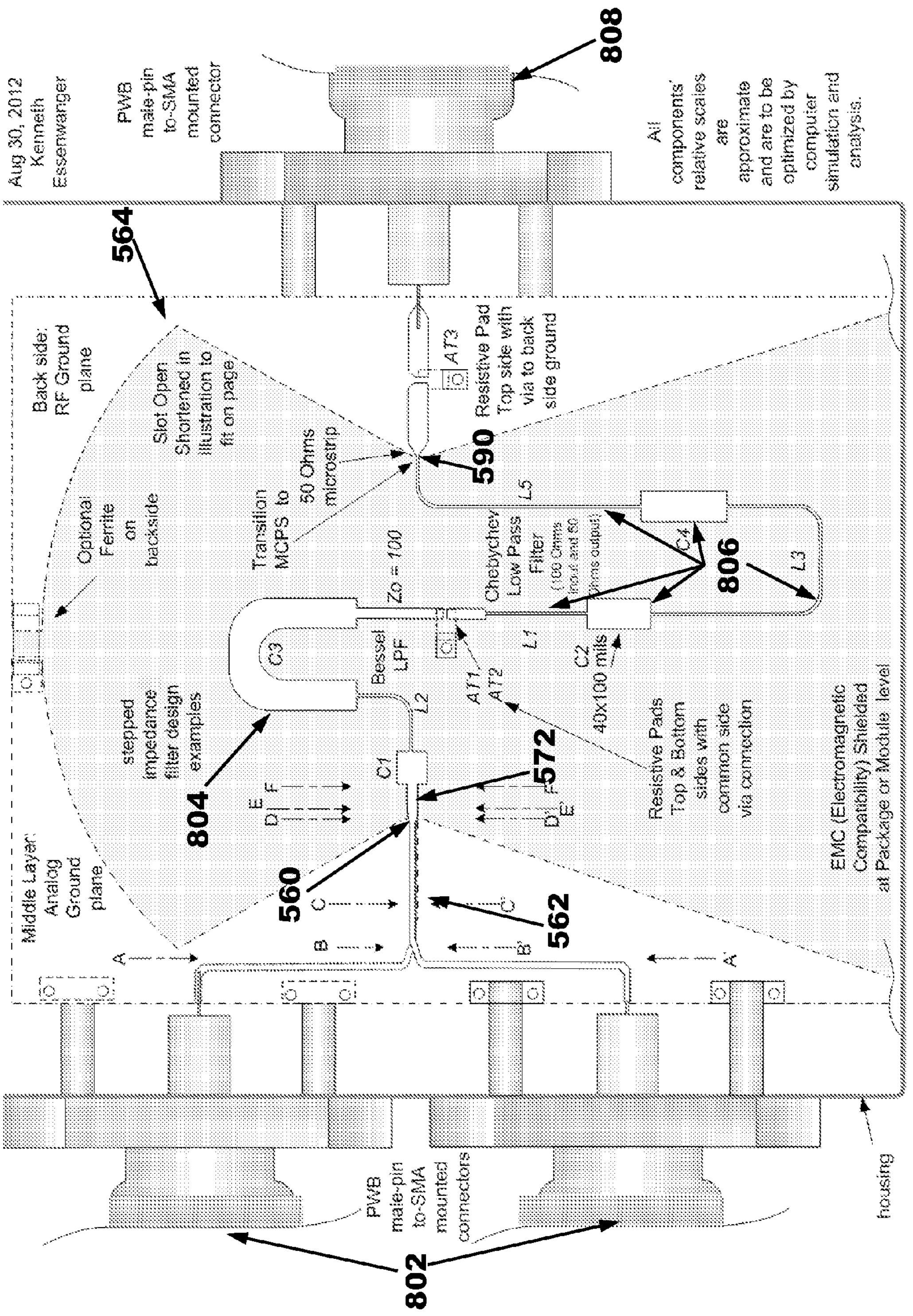

The aperture 564 shown in FIG. 14A and FIG. 14B is similar but not limited to the apertures 314, 514 described with reference to FIGS. 5B and 13B and may be any variety of shapes and/or sizes. The width (W) of the traces 572 over the slotline portion between the transition region 320 (as shown in FIG. 5A) or 560 (as shown in FIG. 14B) and the differential filter 585 (as shown in FIG. 5A) or 804 (as shown with input to C1 in FIG. 14B), in various example balun-filter-balun configurations (e.g., as illustrated in FIG. 14) may be a maximum of one quarter of the maximum operating frequency of the electrical system in which the broadband balun 300, 510*a*, 510*b*, 560 is used. When W reaches or exceeds this maximum value, round-trip reflections in the system may resonate with the input signal. The minimum W of the slotline portion 540 may, for example, be sufficiently wide to produce a slotline impedance $Z_{OS}$ equal to double the total impedance of the balanced portion of the balun $Z_{OB}$ as described above with reference to FIGS. 2A and 2B. The total impedance of the slotline $Z_{OS}$ can be related to W according to any number of known methods, including for example, at least one of the Transverse Resonance Method, Galerkin's Method, or Cohn's Numerical Method. When W is less than the minimum value, the impedance of the slotline may approach the total impedance of the second in-phase and anti-phase traces, resulting in additional signal energy coupling into the ground plane aperture 314, 514, 564, thereby increasing insertion loss.

FIG. 14B illustrates an example electrical system for use with the balun circuit 550 of FIG. 14A in various embodiments. In such embodiments SubMiniature version A (SMA) connectors 802 propagate an unbalanced differential signal to the unbalanced portion 562 of the broadband balun 560 which is thereby transitioned to the balanced portion 572. Following the transition, differential filters 585 (e.g., a Bessel Low Pass filter 804 and a Chebychev Low Pass filter 806 are applied to the balanced signal, which is then transitioned to a single-ended, unbalanced signal by a balun 590. The single-ended, unbalanced signal is then propagated to an output SMA connector 808. Such embodiments may be useful, for example, for reducing noise and/or improving the image clarity of still images and/or video imagery. Such embodiments may also be useful for improving clock switching during direct digital synthesis (DDS) to improve common-mode rejection and prevent differential signal reflections and provide more accurate signal characterization functionality in, for example, electronic warfare systems. It will be apparent in view of this disclosure that Bessel filters and Chebychev filters are used by way of example only and that any filter or combination of filters may be used to perform various functions within an electrical system in accordance with various embodiments (e.g., reducing signal noise, improving image contrast, improving image clarity, filtering video transmissions, and/or reducing differential signal reflections while improving common-mode rejection in DDS). It will be further apparent in view of this disclosure that SMA connectors are used by way of example only and that any connector and/or combination of connectors may be used propagate one or more unbalanced signals to the unbalanced portion 562 of one or more broadband baluns 560 and for outputting a single-ended unbalanced signal in accordance with various embodiments.

Figure 15:
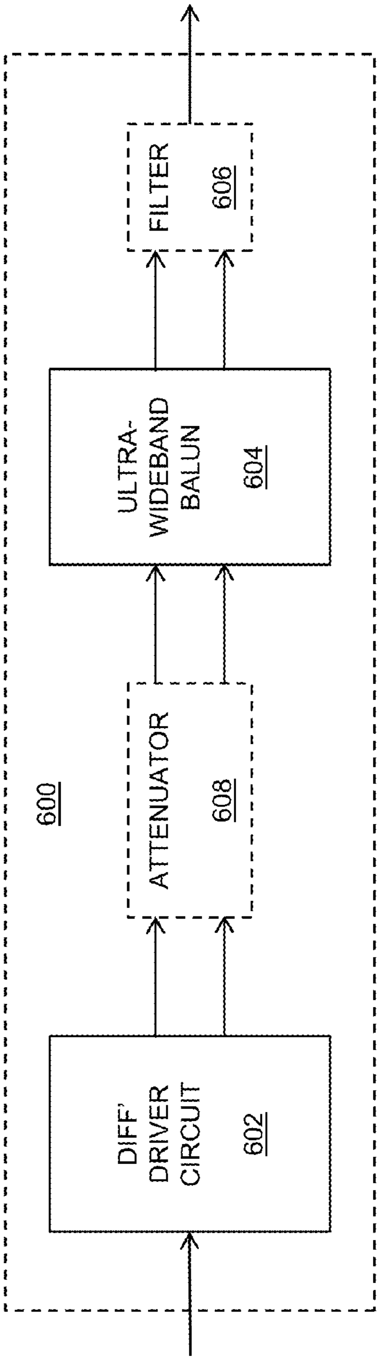
FIG. 15 illustrates a schematic view of an embodiment of an integrated circuit including a differential driver and a wideband balun.

FIG. 15 illustrates a schematic view of an embodiment of an integrated circuit 600 including a differential driver circuit 602 and a wideband balun 604. The differential driver circuit provides a differential signal input to the balun 604. The differential signal includes an in-phase signal input and an anti-phase signal input, each signal input, each representing a mirror image of the other about an analog ground. Thus, for a sinusoidal signal, an increasing positive signal present on the in-phase signal input would correspond to a decreasing negative signal present on the anti-phase signal input. A current having a magnitude and direction on one of the differential signal inputs corresponds to a current having equal magnitude and opposite direction on the other differential signal input.

The balun 604 can be an ultra-wideband balun constructed according to the techniques described herein. In some embodiments, the balanced output of the balun 604 is filtered, for example by a differential filter 606. Alternatively or in addition, the integrated circuit includes an attenuator 608 (shown in phantom) or other suitable device to reduce deleterious effects of any mismatch between the driver circuit 602 and the balun 604. Although the example embodiment describes an integrated circuit having a differential driver circuit 602, it is envisioned that a similar circuit can be constructed having a differential receiver circuit. In a differential receiver circuit, signal propagation is from the balun 604 toward the differential receiver.

Figure 16:
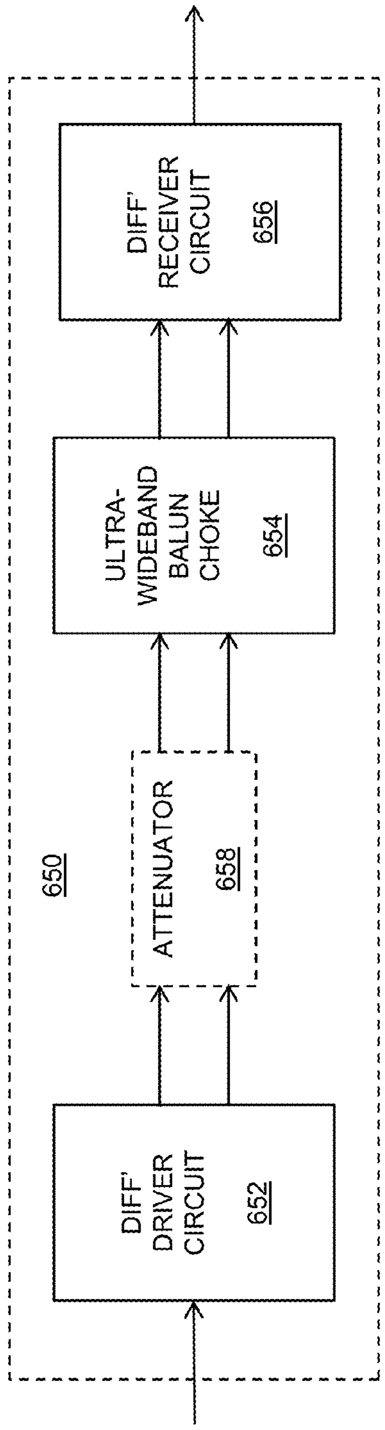
FIG. 16 illustrates a schematic view of another embodiment of an integrated circuit including a differential driver, a wideband balun choke, and a differential receiver.

FIG. 16 illustrates a schematic view of another embodiment of an integrated circuit 650 including a differential driver 652, a wideband balun choke 654, and a differential receiver 656. The differential driver circuit 652 provides a differential signal input to the wideband choke 654. The differential signal includes desirable odd-mode currents (i.e., in-phase and anti-phase currents) as well as undesirable even-mode currents not contributing to the differential signal. The choke 654 is configured to suppress or otherwise remove the unwanted even mode signals, generally referred to as common-mode interference.

In at least some embodiments, the choke 654 includes two baluns arranged in a back-to-back configuration, coupled together at their respective balanced portions, such as the arrangement illustrated in FIG. 13. Each of the baluns can be an ultra-wideband balun constructed according to the techniques described herein. In at least some embodiments, the integrated circuit 650 also includes a differential receiver circuit 656 receiving the differential signal without the unwanted common-mode interference, it having been removed by the choke 654. Alternatively or in addition, the integrated circuit includes an attenuator 658 (shown in phantom) or other suitable device to reduce deleterious effects of any mismatch between the driver circuit 652 and the balun 654.

Figure 17:
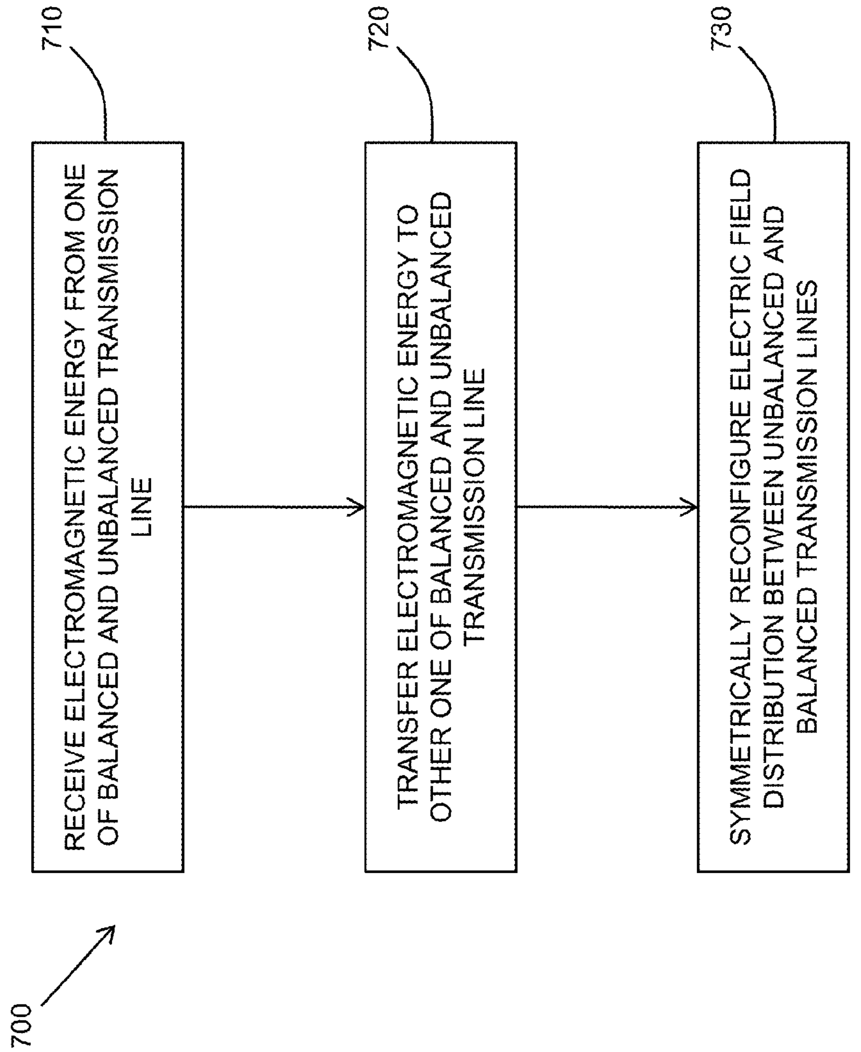
FIG. 17 illustrates a flow diagram of a process for coupling differential signals between unbalanced and balanced transmission lines.

FIG. 17 illustrates a flow diagram 700 of an embodiment of a process for coupling differential signals between unbalanced and balanced transmission lines. In particular, the process provides for efficiently coupling the transfer of electromagnetic energy between an unbalanced differential transmission line having at least one analog ground reference and a balanced differential transmission lines without any such analog ground reference. Electromagnetic energy is first received at step 710 from one of the unbalanced and the balanced differential transmission lines. The electromagnetic energy is received by way of a propagating transverse electromagnetic (TEM) or Quasi-TEM wave. The received TEM wave has a first transverse electric field distribution symmetric about an axial centerline. The received electromagnetic energy is transferred at step 720 to the other one of the unbalanced and the balanced differential transmission lines. The transferred TEM wave has a second transverse electric field distribution symmetric about an axial centerline.

The electric field distribution is symmetrically reconfigured at step 730 along a transition region between the unbalanced and balanced differential transmission lines. The first and second electromagnetic field distributions result from geometries of their respective unbalanced and balanced transmission line configurations and their effect on the transverse electric fields by way of electromagnetic boundary conditions. In the re-configuration, the first electromagnetic field distribution is preferably modified in a gradual manner along the axial centerline to conform to the second electromagnetic field distribution. Preferably, the reconfiguration minimizes reflection of electromagnetic energy over a relatively wide operational bandwidth. For example, the operational bandwidth can be at least 10:1. In at least some embodiments, the operational bandwidth includes sub-centimeter wavelengths. Alternatively or in addition, the operational bandwidth includes sub-millimeter wavelengths.

SiGe Example:

In a first example, an integrated circuit implementation of a balun includes differential microstrip unbalanced portion and a parallel-conductor balanced portion. Considering an IBM SiGe-7hp process, five metal layers are available, each separated from adjacent layers by a material having a dielectric constant ($\in_r$) of about 3.1 and a distance ($H_U$) of about 1.2 μm, and deep trench isolation for substantial termination of a grounded substrate in the transition region of the balun. A characteristic impedance $Z_0$ of a microstrip waveguide can be calculated according to well known techniques, such as those developed by H. A. Wheeler and described in "Microwave Engineer's Handbook, Vol. I", by T. Saad, Ed., 1971, p. 137. The Saad reference includes a series of parametric curves according to dielectric constant for a microstrip's characteristic impedance versus its width-to-height ratio. In particular, the curves are provided for ratios greater than 0.1 (w/h>0.1), which is referred to as a wide strip approximation. From Saad, a width-to-height ratio of about 2.4 is required for a $Z_0$ of 50 Ohms, which requires a width ($W_U$) of about 3 μm. Thus, for an embodiment of a wideband balun constructed a semiconductor according to the IBM SiGe-7hp process, and having an "over-under" arrangement in the unbalanced portion (e.g., similar to that shown in FIG. 2A), the width ($W_U$) of each of the respective in-phase and anti-phase traces would be about 3 μm, for a design characteristic impedance $Z_{0U}$=50 Ohms for each of the in-phase and anti-phase microstrip waveguides.

The balanced portion can be formed by removal of the ground plane layer resulting in a parallel plate waveguide arrangement (e.g., similar to that shown in FIG. 2B). Removal of the ground plane results in a separation between the in-phase and anti-phase traces ($H_B$) of the balanced portion of about 3.25 μm. This represents twice the separation distance between layers (i.e., 2×1.2 μm), plus the thickness of the removed metal layer (i.e., about 0.85 μm).

An approximate relationship between trace width (w), separation distance (h) and characteristic impedance ($Z_0$) of a parallel plate waveguide is provided by $Z_0=377/(\in_r)*(h/w)$, discussed in "Microwave Engineering and Applications," by O. P. Gandhi, 1981, p. 53. This relationship can be used to estimate the approximate trace widths ($W_B$) for a design characteristic impedance (e.g., 100 Ohms), neglecting fringe capacitance. Thus, for target characteristic impedance of 100 Ohms and given a separation distance ($H_B$) of 3.25 μm, the width ($W_B$) of the in-phase and anti-phase traces of the balanced over-under configuration is about 7 μm.

Transition from the unbalanced portion trace width ($W_U$) of 3 μm to the balanced portion trace width ($W_B$) of 7 μm can be implemented as a step discontinuity. Alternatively, such a transition can be accomplished using well known techniques to compensate for excess reactance associated with such size differences. At least one approach is to provide linear chamfer (taper) at the discontinuity. For example, a 45 deg. linear taper can be provided in the transition region. The taper length depends upon the step ratio, the dielectric constant value, and the substrate thickness. As described by K. C. Gupta et al., three such width transitions include linear tapers, curved tapers, and partial linear tapers. Under some circumstances, a taper may not be necessary.

Any of the in-phase and anti-phase traces and ground planes described herein can be fabricated from electrically conductive materials. Conductive materials include metals, such as silver, copper, gold, aluminum and tin; metallic alloys, such as brass and bronze; semi-metallic electrical conductors, such as graphite; and combinations of any such materials.

Any of the dielectric layers described herein can be fabricated from an insulating material, also being an efficient supporter of electrostatic fields, such as air, porcelain (ceramic), mica, glass, plastics, and the oxides of various metals.

Any of the baluns and balun circuits described herein can be fabricated as printed circuit board (PCB) assemblies having one or more conducting layers supported by one or more dielectric or insulating layers. Conducting layers of PCBs are typically made of thin, conductive foil, such as copper. Dielectric or insulating layers can be laminated together with epoxy resin. Dielectrics can be chosen to provide different insulating values depending on the requirements of the circuit. Some of these dielectrics are polytetrafluoroethylene (e.g., Teflon), FR-4, FR-1, CEM-1 or CEM-3. Other materials used in the PCB industry are FR-2 (Phenolic cotton paper), FR-3 (Cotton paper and epoxy), FR-4 (Woven glass and epoxy), FR-5 (Woven glass and epoxy), FR-6 (Matte glass and polyester), G-10 (Woven glass and epoxy), CEM-1 (Cotton paper and epoxy), CEM-2 (Cotton paper and epoxy), CEM-3 (Woven glass and epoxy), CEM-4 (Woven glass and epoxy), CEM-5 (Woven glass and polyester).

Any of the baluns and balun circuits described herein can be fabricated as integrated circuits having one or more electrically conductive layers (e.g., traces and ground planes) separated from each other by one or more insulting layers. Such balun circuits can be formed on a semiconductor substrate, such as Silicon, Germanium, III-V materials, such as Gallium-Arsenide (GaAs), and combinations of such semiconductors. In some embodiments, the balun circuits are formed as a monolithic integrated circuit. Alternatively, balun circuits can be formed as multi-chip assemblies.

Comprise, include, and/or plural forms of each are open ended and include the listed parts and can include additional parts that are not listed. And/or is open ended and includes one or more of the listed parts and combinations of the listed parts.

One skilled in the art will realize the invention may be embodied in other specific forms without departing from the spirit or essential characteristics thereof. The foregoing embodiments are therefore to be considered in all respects illustrative rather than limiting of the invention described herein. Scope of the invention is thus indicated by the appended claims, rather than by the foregoing description, and all changes that come within the meaning and range of equivalency of the claims are therefore intended to be embraced therein.

What is claimed is:

1. An electrical system comprising:

at least one ground plane defining one or more apertures; and a broadband balun comprising:

an unbalanced transmission line portion, including a first in-phase trace extending along a longitudinal axis, a first anti-phase trace extending parallel to the first in-phase trace, and the at least one ground plane parallel to, electromagnetically coupled with, and physically isolated from each of the first in-phase and anti-phase traces;

a balanced transmission line portion, the balanced transmission line portion including a second in-phase trace in electrical communication with the first in-phase trace, and a second anti-phase trace in electrical communication with the first anti-phase trace, each of the second in-phase and anti-phase traces being vertically broadside with its respective first in-phase and anti-phase traces and substantially uncoupled to the at least one ground plane, wherein at least a portion of the one or more apertures defined by the at least one ground plane is positioned at least one of between, above, or below the second in-phase trace and the second anti-phase trace, and;

a transition region disposed between the unbalanced transmission line portion and the balanced transmission line portion, the transition region comprising a respective terminal edge defining a boundary of each of the at least one ground planes between the unbalanced and balanced transmission line portions and a ground plane edge variation extending along the longitudinal axis for a predetermined length measured from the respective terminal edge, wherein respective cross sections of each of the unbalanced, balanced and transition regions are substantially symmetric with respect to the longitudinal axis.

2. The electrical system of claim 1, wherein at least one aperture of the one or more apertures defined by the at least one ground plane is oriented perpendicularly to a propagation direction of the broadband balun, wherein the at least one aperture further comprises:

a slotline portion having a width, a first length and a second length; and at least one slotline-open portion comprising:

an open taper extending from the slotline portion at an open angle of 0-180 degrees, and;

an end region adjacent the open taper opposite the slotline portion.

3. The electrical system of claim 2, further comprising a second broadband balun of similar construction, having a balanced transmission line portion coupled to the balanced transmission line portion of the broadband balun, in a back-to-back configuration.

4. The electrical system of claim 3, wherein the minimum width of the slotline portion is greater than a minimum width required for $Z_{OS}=2Z_{OB}$ and less than a quarter-wavelength of a maximum operating frequency of the electrical system, wherein $Z_{OS}$ is a slotline impedance, $Z_{OB}$ is an impedance minimum of the balanced transmission line portion, and the width of the slotline portion is related to $Z_{OS}$ according to at least one of a Transverse Resonance Method, Galerkin's Method, or Cohn's Numerical Method.

5. The electrical system of claim 3, wherein the first length of the slotline portion extends from a first side of the broadband balun and the second length of the slotline portion extends from a second side of the broadband balun, further wherein each of the first length and the second length is greater than or equal to a thickness (h) of dielectric material when $W/h<0.5$ and greater than or equal to zero when $W/h>=0.5$ between the second in-phase trace and the second anti-phase trace and less than a quarter-wavelength of a maximum operating frequency of the electrical system.

6. The electrical system of claim 2, further comprising:

a differential filter coupled to an end of the balanced transmission line portion opposite the transition region; and a second balun configured to transition a balanced, filtered output of the differential filter to a second unbalanced transmission line portion.

7. The electrical system of claim 6, wherein the width of the slotline portion between the transition region and the differential filter is greater than a minimum width required for $Z_{OS}=2Z_{OB}$ and less than a quarter-wavelength of a maximum operating frequency of the electrical system, wherein $Z_{OS}$ is a slotline impedance, $Z_{OB}$ is an impedance minimum of the balanced transmission line portion, and the width of the slotline portion is related to $Z_{OS}$ according to at least one of a Transverse Resonance Method, Galerkin's Method, or Cohn's Numerical Method.

8. The electrical system of claim 2, wherein the open taper further comprises an open angle of 60-110 degrees.

9. The electrical system of claim 2, wherein the end region is a flat end.

10. The electrical system of claim 2, wherein the end region is open.

11. The electrical system of claim 2, wherein the end region is semi-circular.

12. The electrical system of claim 11, wherein the semi-circular end region has a radius greater than a quarter-wavelength of the maximum operating frequency of the electrical system and less than a wavelength of the lowest operating frequency of the electrical system.

13. The electrical system of claim 1, wherein at least one of the one or more apertures defined by the at least one ground plane is oriented perpendicularly to the broadband balun and further comprises:

a slotline portion having a width and a length; and at least one slotline-open portion comprising a circle extending from the slotline portion.

14. The electrical system of claim 1, wherein the second in-phase trace is vertically aligned with the second anti-phase trace.

15. The electrical system of claim 1, wherein the second in-phase trace is vertically offset from the second anti-phase trace.

* * * * *